US010303543B1

(12) United States Patent
MacLaren

(10) Patent No.: US 10,303,543 B1
(45) Date of Patent: May 28, 2019

(54) SYSTEM AND METHOD FOR MEMORY CONTROL HAVING ADDRESS INTEGRITY PROTECTION FOR ERROR-PROTECTED DATA WORDS OF MEMORY TRANSACTIONS

(71) Applicant: CADENCE DESIGN SYSTEMS, INC., San Jose, CA (US)

(72) Inventor: John M. MacLaren, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 54 days.

(21) Appl. No.: 15/609,539

(22) Filed: May 31, 2017

Related U.S. Application Data

(63) Continuation-in-part of application No. 15/428,719, filed on Feb. 9, 2017.

(51) Int. Cl.
| | |
|---|---|
| *G06F 11/00* | (2006.01) |
| *G06F 11/10* | (2006.01) |
| *H03M 13/09* | (2006.01) |
| *G06F 11/30* | (2006.01) |
| *G06F 11/34* | (2006.01) |

(52) U.S. Cl.
CPC ...... *G06F 11/1004* (2013.01); *G06F 11/3037* (2013.01); *G06F 11/3471* (2013.01); *H03M 13/098* (2013.01)

(58) Field of Classification Search
None
See application file for complete search history.

(56) References Cited

U.S. PATENT DOCUMENTS

| 5,751,740 A * | 5/1998 | Helbig, Sr. | G06F 11/10 711/203 |
|---|---|---|---|
| 6,330,373 B1 * | 12/2001 | McKinney | G06T 5/002 382/103 |
| 8,843,805 B1 * | 9/2014 | Goel | G11C 7/24 714/763 |
| 9,436,632 B2 * | 9/2016 | Bains | G06F 11/10 |
| 9,817,714 B2 * | 11/2017 | Halbert | G06F 11/1068 |
| 2008/0109704 A1 * | 5/2008 | Christenson | G06F 11/1048 714/766 |
| 2013/0139030 A1 * | 5/2013 | Okubo | G06F 11/1048 714/755 |

(Continued)

*Primary Examiner* — Daniel F. McMahon
(74) *Attorney, Agent, or Firm* — Rosenberg, Klein & Lee

(57) ABSTRACT

A system and method are provided to control error-protected access to a memory device having address integrity protection for data words of memory transactions. A communication port receives a command having a port address, which is adaptively converted to a memory address by an interface portion. The interface portion includes an adaptation stage carrying out a predefined adaptation response on an address propagated therethrough during a clock cycle of operation. An address protection portion configures the adaptation stage to maintain the predefined adaptation response over at least two clock cycles. Address error is detected based on comparison of output addresses respectively generated upon iterative propagation of the same input address through the adaptation stage over the clock cycles. A command control portion executes to adaptively split each command received from the interface portion, as well as the corresponding memory address according to an inline storage configuration of the memory device.

20 Claims, 21 Drawing Sheets

(56) References Cited

U.S. PATENT DOCUMENTS

2013/0254630 A1* 9/2013 Murray ............... G06F 11/1072
                                                    714/773
2017/0255509 A1* 9/2017 Tsuboi ................ G06F 11/1044

* cited by examiner

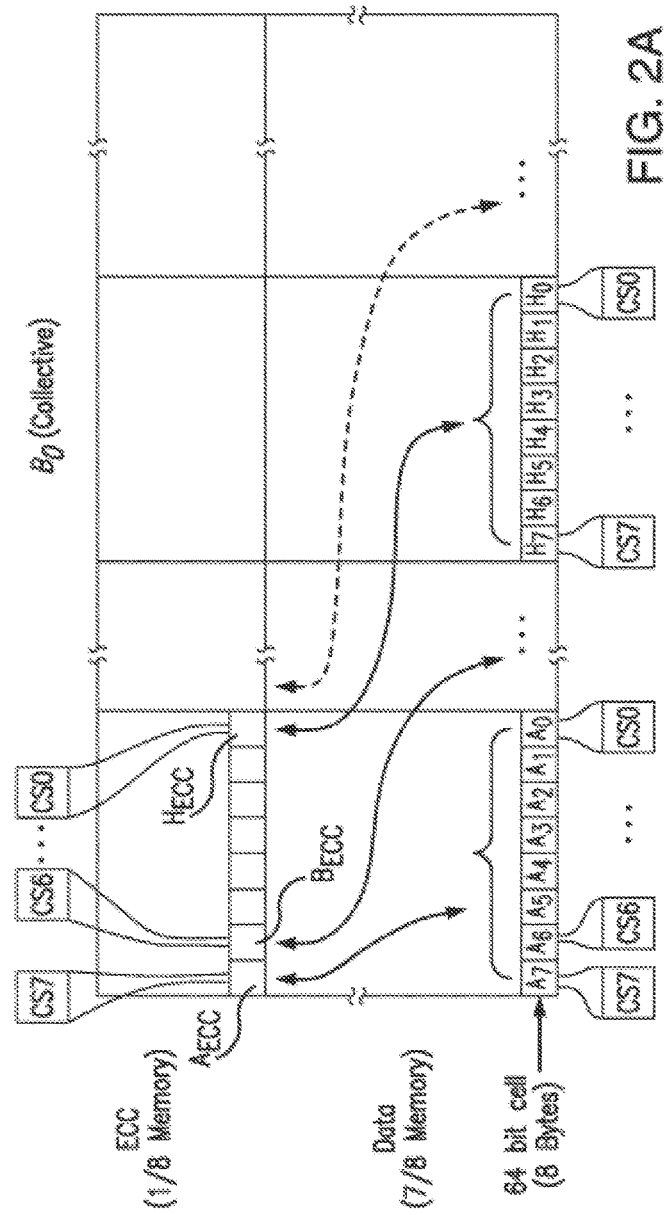
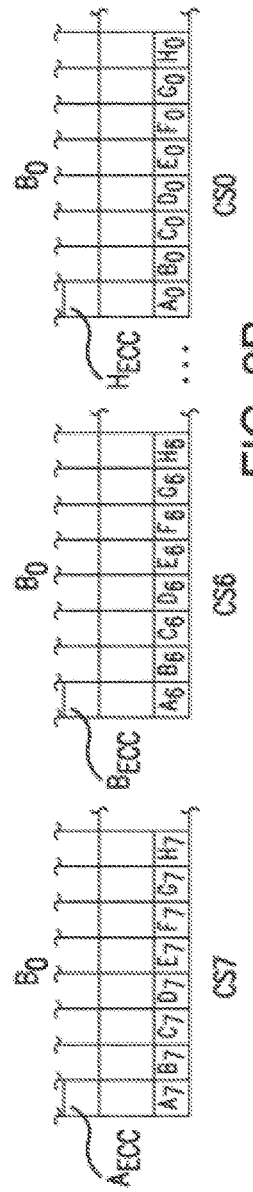
FIG. 2A
FIG. 2B

| 31 | 30 | 16 | 15 | 13 | 12 | 3 | 2 | 0 |
|---|---|---|---|---|---|---|---|---|
| CS | ROW | | | BANK | COLUMN | | Data Path | |

FIG. 7

| 33 | 32 | 31 | 30 | 16 | 15 | 13 | 12 | 3 | 2 | 0 |
|---|---|---|---|---|---|---|---|---|---|---|
| CS | CID | | ROW | | | BANK | COLUMN | | Data Path | |

FIG. 8

SYSTEM AND METHOD FOR MEMORY CONTROL HAVING ADDRESS INTEGRITY PROTECTION FOR ERROR-PROTECTED DATA WORDS OF MEMORY TRANSACTIONS

RELATED APPLICATIONS DATA

This Application is a Continuation-In-Part of co-pending U.S. application Ser. No. 15/428,719, filed 9 Feb. 2017.

BACKGROUND OF THE INVENTION

The subject system and method are generally directed to memory controllers for controlling highly reliable access to memory devices for data words stored with both data bits and associated error checking bits. The system and method include measures for preserving the integrity of address bits corresponding to the data words that are to be read and/or written in connection with a given memory transaction. In certain embodiments and applications, the subject system and method accomplish this by productively exploiting the capabilities of a memory controller executable to dynamically adapt memory transactions involving such error-protected data words in accordance with an inline memory storage paradigm.

More specifically, the subject system and method make use of the built-in redundancy of address bit checking inherent to such memory controller's use of adaptively split addressing for the data and error checking components of data words. The subject method and system supplement this inherent capability to preserve address protection through the full address path, effectively from where the memory controller receives a memory transaction through its interface ports to where it executes the memory transaction through its split-address processing for memory device access.

Memory controllers are well known in the art. They are implemented as digital circuits dedicated to controlling/managing the flow of data written to and read from one or more memory devices. They may be suitably formed as separate devices or integrated with a central processing unit or other main controller, and serve the memory storage and access needs of various control or user application 'master' operations processed thereby. Memory controllers implement the logic necessary to read from and write to various types of memory devices, examples of which include dynamic random access memory (DRAM), as well as electrically programmable types of non-volatile memory such as flash memory, and the like.

To minimize the consequences of data corruption due to random sources of error, various error checking measures for detection and/or correction are employed in the art for the storage and retrieval of data from memory devices. One example of the various known measures is the use of an Error Correcting Code (ECC) for detection and/or correction of error in data words. ECC measures are widely implemented in memory controllers heretofore known in various computer applications that may be particularly vulnerable to data corruption, or more generally in high data rate or other such applications where substantial immunity to data corruption is particularly important, and the added processing burden and complexity of ECC are not prohibitive. ECC measures generally involve adding redundant ECC bits to a transmitted data segment according to a predetermined code (of selected ECC format). These ECC bits are of parity-type, and permit the data segment to be properly recovered at the receiving end (by a receiving/recovery measures suitably configured for the given ECC format), even if certain correctable errors were introduced in the transmission or storage of that data segment. The degree to which the errors are correctable would depend on the relevant properties of the particular code being used.

In addition to the need to guard against corruption of the data bits carrying the substantive information involved in memory transactions, there is corresponding need to guard against corruption of the address bits identifying the memory storage locations of those data bits. After all, data bits properly read from or written to an incorrect location are just as corruptive as data bits improperly read from or written to a correct location. Yet, the integrity of the address bits for data bits involved in memory transactions are typically not as safely guarded as the data bits themselves.

Known memory controllers are widely configured for storage of such ECC-protected data according to the so-called sideband ECC storage format. They generally transmit, receive, and store data words. With increasing data speed and memory capacities, data word formats have grown to be defined by numerous multi-bit bytes. In typical ECC-protected memory controller applications, for example, a data word may be defined by 72 total bits, segmented into eight 8-bit data bytes and one 8-bit ECC byte (or one ECC bit for each 8-bit data byte). The multiple data bytes of each data word are often stored for high capacity applications in a memory device formed by a plurality of integrated circuit chips. Each data byte in those applications is stored in a different selectable chip, though at the same relative address within each chip. Sideband storage of ECC and data bits provides for an additional chip in which to store the ECC byte associated with the given data word's data bytes. The data word's ECC byte is then stored much like its data bytes—at the same intra-chip address as those data bytes, but in its designated sideband ECC chip(s). So in the case of a 72-bit data word (formed by 8 data bytes plus 1 ECC byte), for example, the data word is stored across nine selectable chips, eight for the data bytes and one for the associated ECC byte.

Memory transactions for reading and writing data to/from memory initiated by master control operations in many applications contemplate such sideband storage of ECC bytes with their associated data bytes. But a memory device sufficiently equipped to support sideband storage may not be available in certain applications, though the need for ECC protection for memory transactions remains. This may be due to various reasons in practice, reasons such as: form factor limitations, cost constraints, prohibitive memory technology, or the like. The memory controller system disclosed herein provides for dynamically adapting a memory transaction for inline storage configurations, where different portions of given data words are stored at different intra-chip addresses with split addressing for data and ECC bytes. The split addressing provides a built-in check against address corruption since a corruption in either of the addresses for data and ECC bytes will become apparent when ECC check is made therefor. But such protection against address corruption does not reach beyond those portions of the memory controller system outside the split addressed processing. There is therefore a need for suitable measures to extend address protection for the data words of memory transactions carried out by a memory controller system through the entire address path, including those portions of the path outside the split addressed processing carried out for inline storage of corresponding data and error-checking bytes.

SUMMARY OF THE INVENTION

It is an object of the present invention to provide a system and method for memory control that preserves address protection for the data words of memory transactions carried out by a memory controller system through the entire address path.

It is another object of the present invention to provide a system and method for memory control that provides simple yet reliable address integrity protection for those portions of the path outside the split addressed processing carried out for inline storage of corresponding data and error-checking bytes.

These and other objects are attained in a system for controlling error-protected access to a memory device having address integrity protection for data words of memory transactions. The system includes a communication port receiving commands for the memory transactions from a master control operation, each command having a port address predetermined for at least one data word corresponding to a memory transaction. An interface portion is coupled to the communication port, which interface portion adaptively converts the port address to a memory address. The interface portion includes at least one adaptation stage carrying out a predefined adaptation response on an address propagated therethrough during a clock cycle of operation. An address protection portion is coupled to the interface portion, which configures the adaptation stage to maintain the predefined adaptation response thereof over at least two clock cycles. The address protection portion detects address error based on comparison of output addresses respectively generated upon propagation of a common input address through the adaptation stage during each of the clock cycles. A command control portion executes on a processor to actuate access to the memory device responsive to each command received with a corresponding memory address from the interface portion. The command control portion executes to adaptively split the command into at least data access and error checking access commands having respective split addresses, the split addresses being mutually offset in value according to an inline storage configuration of the memory device.

In accordance with certain embodiments, a memory controller system is provided for controlling error-protected access to a memory device having address integrity protection for data words of memory transactions. The system includes a communication port receiving commands for the memory transactions from a master control operation, each command having a port address predetermined for at least one data word corresponding to a memory transaction. An interface portion coupled to said communication port adaptively converts the port address to a memory address. The interface portion includes a plurality of adaptation stages intercoupled through intermediate registers for pipelined execution, each said adaptation stage carrying out a predefined adaptation response on an address propagated therethrough during a clock cycle of operation. An address protection portion is coupled to the interface portion, wherein the address protection portion configures each said adaptation stage to preserve the predefined adaptation response thereof over at least two consecutive clock cycles. The address protection portion detects address error for each of the adaptation stages based on comparison of output addresses respectively generated upon propagation of a common input address through the adaptation stage during each of the consecutive clock cycles. The address protection portion includes an error validation component executing to selectively validate the address error detection of each adaptation stage based on the predefined adaptation response thereof remaining constant over the consecutive clock cycles. A command control portion executing on a processor serves to actuate access to the memory device responsive to each command received with a corresponding memory address from the interface portion. The command control portion executes to adaptively split the command into at least data access and error checking access commands having respective split addresses, the split addresses being mutually offset in value according to an inline storage configuration of the memory device.

In accordance with certain other embodiments of the present invention a method is provided for controlling error-protected access to a memory device with address integrity protection for data words of memory transactions maintained substantially through an entire address path defined between a communications port and the memory device. The method includes receiving commands for memory transactions from a master control operation through the communication port, each command having a port address predetermined for at least one data word corresponding to a memory transaction. The port address is propagated through an interface portion to adaptively convert the port address to a memory address, the interface portion including at least one conversion stage to carry out a predefined conversion response on an address propagated therethrough during a clock cycle of operation. The conversion stage is configured to maintain the predefined conversion response of the conversion stage constant for each of at least two clock cycles, and the same input address is iteratively propagated through the conversion stage over the clock cycles. Address error is detected based on comparison of output addresses respectively generated by the iterative propagation of the same input address through the conversion stage over the clock cycles to thereby provide address protection through a first part of the address path. A command control portion is executed on a processor to actuate access to the memory device responsive to each command received with a corresponding memory address from the first part of the address path. The command control portion is executed to adaptively split the command into at least data access and error checking access commands having respective split addresses for passage through a second part of the address path, the split addresses being mutually offset in value according to an inline storage configuration of the memory device.

BRIEF DESCRIPTION OF THE DRAWINGS

FIGS. 2A-2B are schematic diagrams illustrating different aspects of an example of an inline storage scheme for data and error checking components of error-protected data words in a memory device;

FIG. 7 illustrates an example of an incoming user address;

FIG. 8 illustrates another example of an incoming user address;

DETAILED DESCRIPTION OF THE PREFERRED EMBODIMENTS

Figure 1:
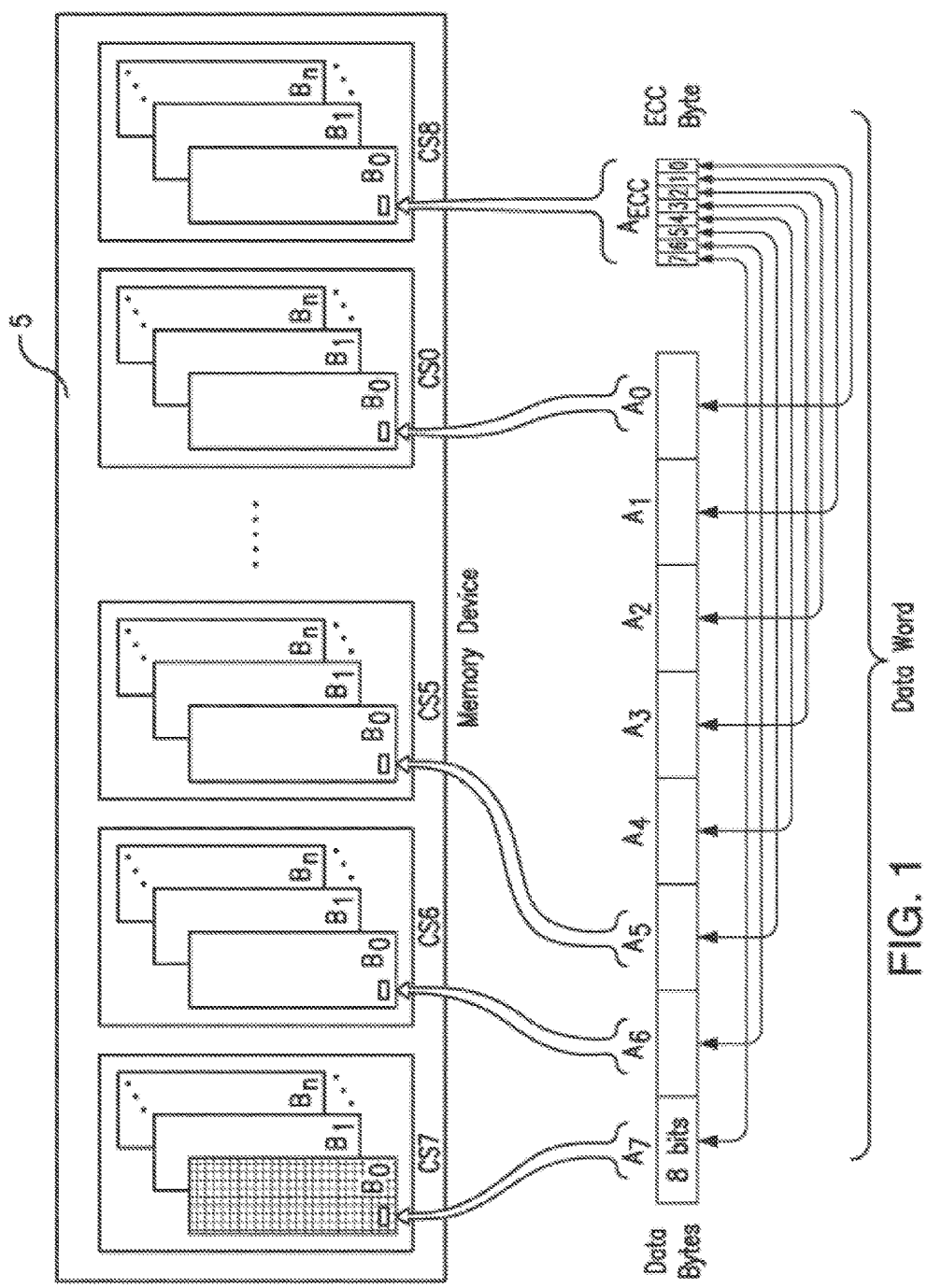
FIG. 1 is a schematic diagram illustrating an example of a sideband storage scheme for data and error checking components of error-protected data words in a memory device.

Reference is now made in illustrative level of detail to exemplary embodiments, which are illustrated in the accompanying drawings, wherein like reference numerals refer to the like elements throughout. The embodiments are described below in order to illustrate and explain the disclosed system and method with reference to the drawing figures.

Briefly, the subject system and method provide for a memory controller suitably equipped with measures to simply yet reliably detect error occurring in the address bits corresponding to data words of a memory transaction received and processed by the memory controller. The protective measures maintain monitoring for substantially all potential points of vulnerability along a flow of processes for the address bits (or address path), from the user interface ports of the memory controller where incoming address bits from a controlling user operation are received, all the way out to and back from the given memory device.

Consider, for example, the case of a controlling operation issuing a memory transaction command to read the data bits stored in memory at a certain multi-bit address according to which both the data bits and error checking bits (such as ECC bits) are stored. If an address bit were to errantly flip in value somewhere along the flow of processes, the data bits would be read erroneously from the wrong storage locations of the memory device. But their corresponding ECC bits would also be read from equally wrong storage locations. Consequently, unless some coincidental bit error happens to occur in the data or ECC bit values themselves, subsequent execution of an ECC check operation would indicate a proper read transaction, even though erroneous data has been read.

Such errant memory transaction would not be detected by the memory controller, and the read data transmitted back to the controlling operation as if it were error-free. In accordance with certain aspects of the present invention, this type of error is avoided by maintaining address bit protection substantially throughout the entire flow of processes covering a memory controller's receipt of a memory transaction through the given port(s), interface adaptation in form of its address, and its execution on the given memory device(s).

In certain preferred embodiments and applications, the subject system and method incorporate protective measures that productively exploit the inherent capabilities of a memory controller executable to provide error-protected memory access, with adaptively split addressing of corresponding data and error checking components of a data word, according to an inline memory storage configuration. As described in more detail in Section A herein, such memory controller operates to effect split storage of the data and error checking components at different mutually offset addresses in the given memory. That is, the memory controller executes to split an incoming memory transaction command for a data word into different commands respectively for accessing memory to read/write the word's data bits according to one address, and the word's corresponding error checking bits at another address.

The divergent addressing of corresponding data and error checking bits for the same data word yields an effective redundancy to the addressing that provides a built in check of address integrity. This contrasts with a case where both the data and error checking bits of a data word were to share the same address value (of different memory chips), such as in a conventional sideband storage configuration. In that case, an error in one or more address bits would make for reading/writing of both the given data word's data and error checking bits from/to equally erroneous, but mutually matching, address locations in memory. So while the data bits are erroneously read from, or written to, the wrong storage location, the error checking bits are likewise read or written according to the same erroneous storage location. Consequently, the correspondence/match between that data and those error checking bits is preserved, notwithstanding the address error. The address error may thus remain undetected (at least by the memory controller).

But with the inline memory storage configuration illustratively described in Section A herein, a command for a memory transaction received by the memory controller is split into respective commands for the data and error checking components, each of the components being associated with a separate address. The addresses are distinct, and preferably defined with a predetermined mutual offset within the given memory space. Consequently, an error in either of the data and error checking component addresses would disrupt the match between those components. The wrong error checking bits, for instance, may be retrieved for the data bits of a given word, or vice versa. Such mismatched combination becomes apparent when error checking is carried out, and error due to faulty-addressing is readily detected as a result.

This may preserve suitable address integrity protection for memory transaction processing from the point where split-addressing occurs, on out to the memory device and back. But those portions of the address path outside such split-addressed processing remain without comparable integrity protection.

In accordance with certain aspects of the present invention, such heretofore unprotected portions of the address path are suitably equipped with simple yet reliable measures to detect compromised address integrity. Briefly, the subject system and method provide for a memory controller that controls error-protected access to one or more memory devices, with address integrity protection preserved where conditions permit along the full address path for memory transaction received from a controlling user operation. In many applications, such as automotive applications, performance requirements permit something less than absolute 100% checking of memory transaction addresses. Typically, the applicable performance standards tolerate the checking of address integrity for less than 100% of the memory transactions processed. A predetermined value of less than 100% may then serve as a threshold validation rate in this regard. For example, a predetermined value of 90% is permitted by one widely accepted standard for automobile applications, namely the ASIL-B certification standard.

This allows for an address error detection to be suspended where certain factors may not be conducive to accurate error detection, then to resume when they return to more conducive levels or form. This may sufficiently relax other tolerances to afford practicable options by which existing logic or other electronic circuit elements may be used to realize acceptable address error validation rates at minimal cost.

The subject memory controller system is served by a communication port that receives commands for memory transactions from a master control operation. The communication port may be formed in the as an integrated part of the system's memory controller portion(s), or as a discrete portion serving the same. Each command is received with a predetermined port address for at least one data word of the memory transaction. The port address is typically received with parity at the communication port. This is preferably checked and discarded by an initial stage of the intervening portion before the address is passed on to the other stages, then on through for further memory control processing. The interface portion is preferably formed by a plurality of pipelined adaptation stages which carry out various transformations to convert the address to a memory address having a form properly adapted for the given memory controller's processing. Each adaptation stage is configured to carry out a certain predefined adaptation response on an address propagated therethrough during a clock cycle of operation. An address protection portion operably coupled to the interface portion serves to configure each adaptation stage such that it maintains the predefined adaptation response on an address over two or more consecutive clock cycles. The address protection portion maintains the adaptation response for the same address propagated therethrough during each of the consecutive clock cycles.

This approach is generally referred to herein as stable address approach, whereby, conditions-permitting, the input address is held consistent for multiple clock cycles of operation and the persistence of adaptation response checked. This provides a simple redundancy-based check for the occurrence of address error, with the system effectively doing a double take on propagating a given address through the adaptation stage. Thus, if an address applied to that stage undergoes the stage's adaptation response to be converted accordingly in form, a second pass of the same address through the stage, under the same operational conditions, should yield the same conversion in form, unless an error occurs. Preferably, the propagation and re-propagation of the same address through an adaptation stage occur over consecutive clock cycles of operation, in the interests of simplicity and efficiency.

Suitable measures are taken by an address protection portion to preserve the operational configuration of the adaptation stage for each propagation of the address therethrough, and maintain the same source address at the stage input for re-propagation. This ensures consistent adaptation response in the absence of bit flip or other such faulty occurrence. Comparing the converted forms of the address resulting from the multiple propagations through the adaptation stage then provides confirmation of address integrity, otherwise detection of a faulty condition indicating a compromised address.

In this way, protection for address integrity is maintained for that portion of the address path up to a command control portion of the given memory controller system which then actuates access to the memory device responsive to the received command and its accompanying address. The command control portion executes to adaptively split the command into at least data access and error checking access command segments, with respective split addresses. The split addresses are mutually offset in value according to an inline storage configuration of the memory device, whereby the data bits are written or read according to one address, while its corresponding ECC or other such error checking bits are written or read according to another, different address set off in memory therefrom.

In some embodiments and applications, a combination of parity and stable address check for address error may be employed. Employing parity check alone may not be practicable in many applications because a parity bit of a given address would be subject to the same transformations, shifts, and other such conversions that the address undergoes as it propagates through an adaptation stage. The additional logic required to maintain corresponding conversion of a parity bit quickly becomes unwieldy in many applications, both in terms of computational processing and circuit structure. Still, where the resources and requirements of the intended application permit, there may be benefits to employing a parity check for certain adaptation stages. In a stage known to be particularly difficult to hold operational configurations consistent over multiple clock cycles, for example, suitable measures may be employed to carry out a parity check through that stage while relying upon a stable address check in the other stages pipelined therewith.

As noted, split addressing for inline ECC converts a single memory transaction command received through the interface port to two or more commands internally (at least data and ECC commands). As the multiple commands resulting from this split are normally processed over multiple clock cycles, there is little if any performance benefit to receiving a memory transaction but more than once every two or more clock cycles. The subject system and method preferably employ suitable measures to keep the address stable for two or more clocks as a baseline for address fault detection. For example, suitable measures are taken where practicable to maintain a persistent address for the given memory transaction over a requisite number of consecutive clock cycles (the minimum number of clock cycles required to carry out the split commands making up the given memory transaction). Multiple phases of the address—that is, the address during each of the consecutive clock cycles—may then be compared for any variation, and address error detected responsive to that comparison. For instance, address error may be detected where the address phases fail to match.

Figure 4:
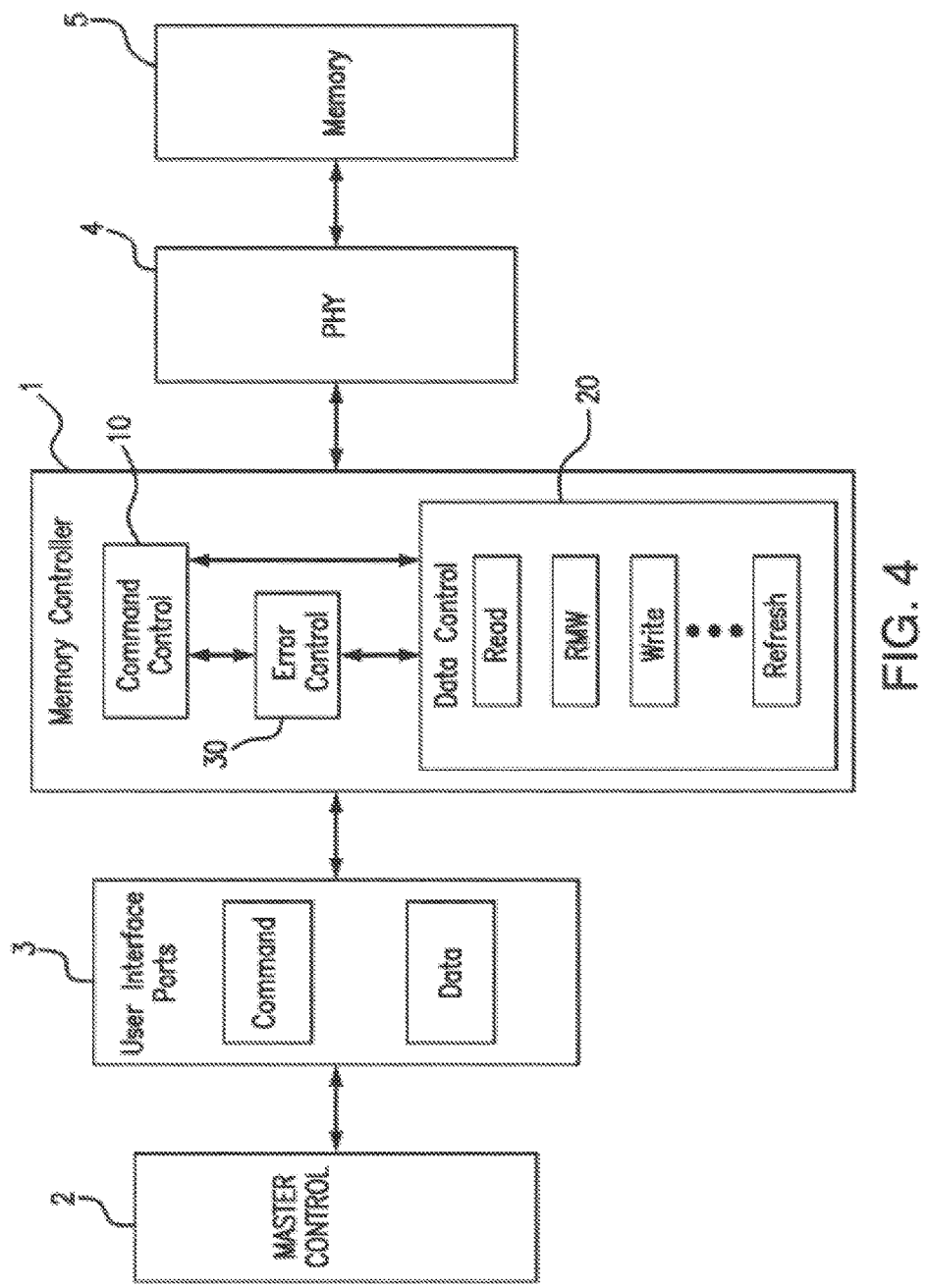
FIG. 4 is a schematic block diagram illustrating a system formed in accordance with one exemplary embodiment of the present invention, operably intercoupled to provide control of memory to support processing of a master control operation, in one illustrative application.

Referring now to FIG. 4, there is shown a general schematic diagram illustrating a memory controller system 1 formed in accordance with one exemplary embodiment of the present invention operably intercoupled with other subsystems in an illustrative application. As generally shown, the memory controller system 1 serves to provide control of a memory 5 (formed by one or more memory devices of any suitable type and configuration known in the art) to support processing of a master control operation by a master controller 2. The memory controller system 1 communicates with the master controller 2 through one or more user interface ports 3, and with the memory device(s) 5 through a physical interface (PHY) 4 configured with a suitable interface standard known in the art for the memory 5.

The overall system schematically illustrated in FIG. 4 may be implemented in any known form, depending on the particular requirements of the intended application. For example, the overall system may be realized by discretely interconnected subsystems, or sufficiently integrated in the form of a system-on-chip (SOC) or the like, depending again on the particular requirements of the intended application. As the master controller, user interface port, PHY, and memory subsystems 2, 3, 4, and 5 may be of any suitable type and configuration known in the art, subject to the particular requirements of a given application, no further description thereof is needed for description of features relating to the memory controller system 1. Those skilled in the art will recognize that the overall system shown will typically include numerous subsystems, logic components, driver circuit portions, and the like other than those generally illustrated in FIG. 4 to carry out particularly intended functions. In the interests of brevity and clarity, those particular functions outside the system and method disclosed herein are not shown, but will be apparent to those skilled in the art in the context of the particular application intended.

Memory controller system 1 generally includes a command control portion 10 coupled to a data control portion 20 and an error control portion 30. In the embodiment shown, the data control portion 20 preferably includes one or more digital circuits which implement the functional logic to carry out a plurality of data access operations on memory 5. These data access operations include read, write, masked write, and read-modify-write (RMW) operations conducted on selectively addressed storage locations defined in the memory 5. The data access operations preferably include control of additional functions for proper interface with the particular type of memory device(s) 5 employed, as well as others known in the art.

The error control portion 30 is operably coupled to the data control portion 20, and preferably includes one or more digital circuits which implement the functional logic for detecting and correcting error in data segments as stored in memory 5. The error control portion 30 preferably includes execution of ECC processing of predetermined code format, such as a format of SECDED type, to detect error in a corrupted data segment read from the memory 5. The error control portion 30 is configured to correct the data segment read from the memory having error that is correctable with the given ECC, and report (for the master control operation) those data segment errors which are detected but are not correctable with the given ECC. The error control portion 30 preferably also provides intermediate storage of ECC bytes generated or read in association with data bytes during the execution of various data access operations, for cooperative transmission with their data bytes either to the PHY 4 (for writing operations) or error-checking of retrieved data for return to the user interface ports 3 (for reading operations).

The command control portion 10 is operably coupled to both the data control and error control portions 20, 30. The command control portion 10 is preferably formed by one or more digital circuits which implement the functional logic for generating commands to actuate various data access operations of the data control portion 20. The command control portion 10 preferably includes suitable units for carrying out memory access operations responsive to memory transactions of user applications involving ECC-protected data words. These include address translation and command translation functions involved in adaptively splitting the memory addressing of ECC and data for inline ECC storage configurations.

As noted, the address preferably goes through multiple pipeline stages and various conversions/transformations as it propagates through the interface portion on to the command control portion 10. The address may be shifted for alignment of its CS, Row, Bank, and Column fields; padded to account for unused pins; transformed to make the address space contiguous across address holes; incremented for transactions too large to be handled as a single command; remapped according to programmable options; masked of unnecessary bits; or the like. The complexities of these transformations make sideband redundancy, such as carrying parity, difficult since each transformation must necessarily be compensated in the calculated parity. The complexities become prohibitively complex where the parity is to be carried through multiple pipelined stages of the interface portion. However, by propagating the same address for two or more clocks in the stable address approach, there is no need to replicate the complexities of the transformations. The same transformations, regardless of complexity, are applied identically on the address, and the resulting address output should remain the same in the absence of error. Detection of error then becomes a simple matter of comparing the results from consecutive clocks of driving a stable address.

Figure 4A:
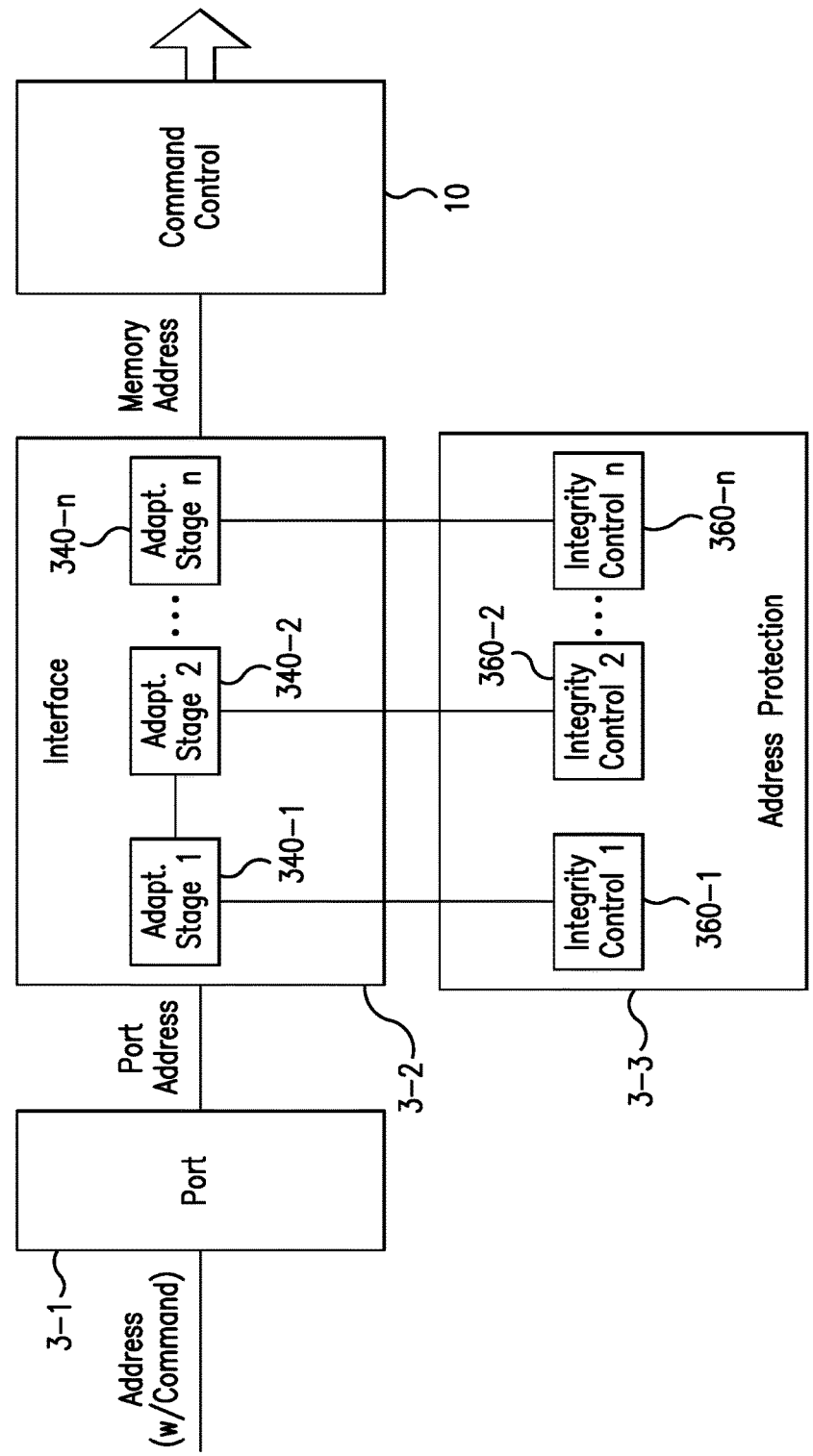
FIG. 4A is a general schematic diagram illustrating in more detail certain portions of the user interface ports of FIG. 4, formed in accordance with one exemplary embodiment of the present invention.

Referring to FIG. 4A, there is shown a general schematic diagram illustrating in more detail certain portions of the user interface ports 3 through which the addressed path flows before being split at the command control portion 10 for further processing, as formed in accordance with one exemplary embodiment of the present invention. The stable address protection scheme is implemented in this embodiment with a communication port 3-1 configured to receive memory transaction commands with corresponding addresses from a controlling user operation. The addresses are received typically with parity check bits; and, suitable measures known in the art are employed to check the parity accordingly then strip parity bits from the addresses. The resulting addresses are then further passed as source addresses through the interface portion 3-2 for appropriate transformation, shifting, masking, padding, or other such conversion required to suit the memory controller system's processing of the memory transactions. The interface portion 3-2 includes a plurality of adaptation stages 340-1, 340-2, . . . 340-*n* pipelined in arrangement through intermediate registers (not shown) to carry out the various conversion operations for the given application.

An address protection portion 3-3 is coupled to the interface portion 3-2 to preserve the conditions necessary for stable address integrity check upon propagation through the adaptation stages 340-1-340-*n* over multiple clock cycles of operation (or over multiple stable address iterations). Preferably, the address protection portion 3-3 in the illustrated embodiment includes integrity control sections 360-1, 360-2, . . . 360-*n* integrated with or otherwise coupled to respective adaptation stages 340-1, . . . 340-*n*. The integrity control sections 360-1-360-*n* of the address protection portion 3-3 preferably serve in this embodiment to maintain consistent operational conditions for each of the adaptation stages 340-1-340-*n*. Toward that end, each of the integrity control sections 360-1-360-*n* implements suitable control logic to ensure that a source address applied to a given adaptation stage 340-1-340-*n* is maintained at the same value for each of the multiple clock cycles of operation. Each integrity control section 360-1-360-*n* also implements suitable control logic to ensure that a stable source address propagates through the adaptation stage along substantially the same path during each stable address iteration.

Preferably, each of the integrity controls sections 360-1-360-*n* of the address protection portion 3-3 is integrated with an adaptation stage 340-1-340-*n* to the extent practicable, to maximize use of existing circuit elements of that adaptation stages. The stable address iterations are preferably carried out over two consecutive clock cycles, so each integrity control section 360-1 . . . 360-*n* seeks to maintain the source address constant at the input of its adaptation stage over two or more consecutive clock cycles.

Each integrity control section 360-1 . . . 360-*n* also includes control logic to keep the conversion effected by the adaptation stage, or that stage's adaptation response, constant during each of the consecutive clock cycles. This ensures that the converted form of the source address at the stage output remains the same for each iteration—barring the occurrence of a fault. The control logic seeks to preserve the operational configuration of any adaptation logic employed in the given stage, and to also keep the switching of any multiplexors (MUX's) employed in the stage constant. All three of these conditions—namely: constant source address, constant configuration of adaptation logic, and constant switching of any MUX's—must be maintained over the consecutive clock cycles in order for error-causing fault conditions to be sufficiently isolated. If not, a mismatch in the output address from the stable address iterations could not be directly attributed to an error. Thus, the address protection portion 3-3 preferably compares the converted addresses for the multiple iterations for error detection, but invalidates the comparison if any of these conditions is not met.

Figure 4B:
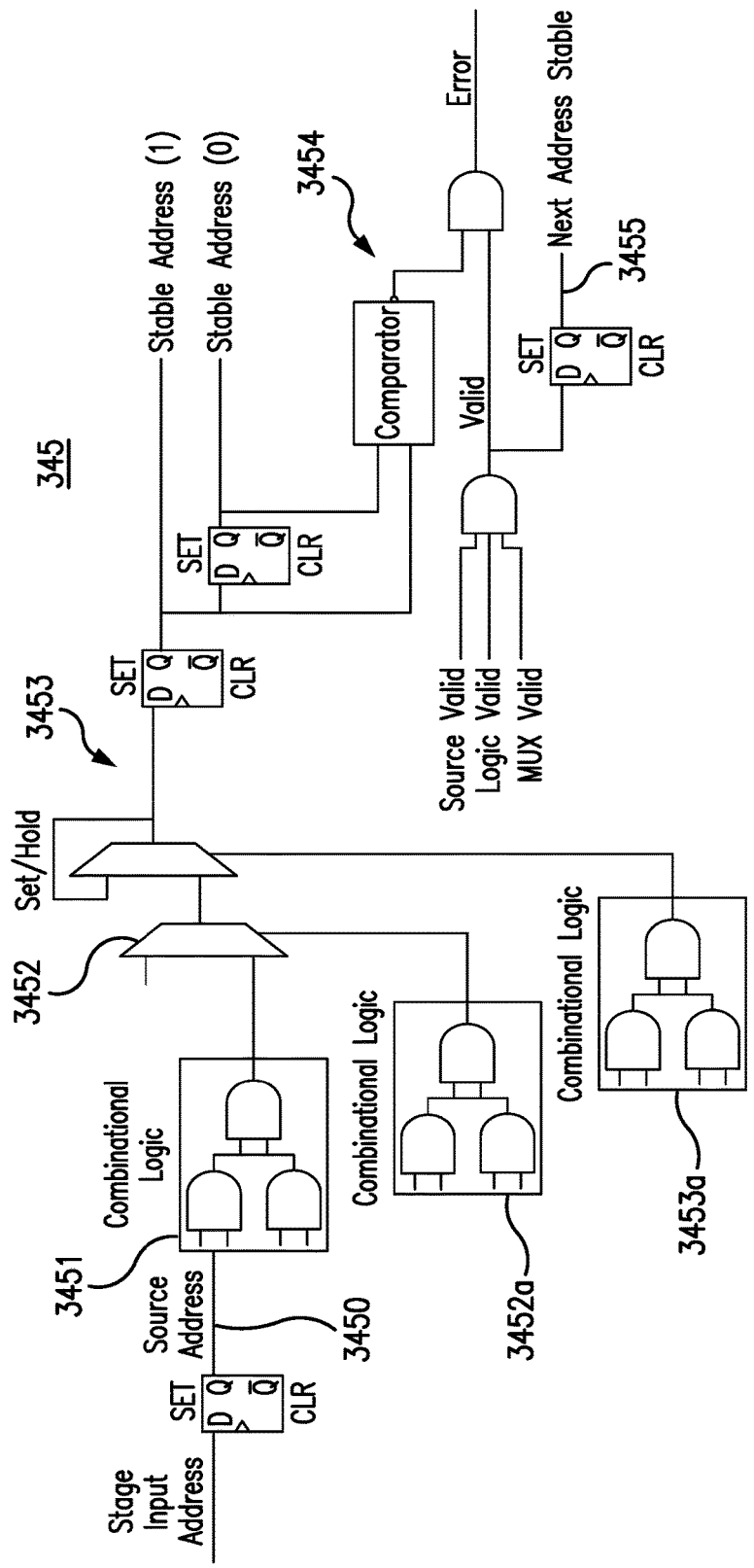
FIG. 4B is symbolic diagram schematically illustrating one example of a generic adaptation stage that may be employed in the address path leading to the command control portion shown in FIG. 4, in accordance with one exemplary embodiment of the present invention.

Turning now to FIG. 4B, there is shown a symbolic diagram schematically illustrating one example of a generic adaptation stage 345 that may employed in the address path leading to the command control portion 10. In the example illustrated, the corresponding integrity control portion for the stage is shown integrated therewith. Each adaptation stage 340-1-340-*n* of the interface portion 3-2 preferably includes—in some form suitable for the intended application—one or more of the segments shown in this generic stage 345.

As symbolically indicated in the generic stage 345, each pipeline stage is preferably configured to include one or more of the following functional components: a source address 3450 coming into the stage, combinational adaptation logic 3452 which the source address will undergo in the stage, one or more MUX's 3452 that the source address will pass through, a set and hold (S/H) circuit 3453, address verification logic 3454, and next address stable indication 3455 at the stage's output end. Preferably integrated in with these components are control logic 3452*a* for switching control of the one or more MUX's 3452, and control logic 3453*a* for switching control of the S/H circuit 3453.

The combinational logic making up the components 3451, 3452*a*, 3453*a* is symbolically represented, as each will vary according to the particularly intended application and implementation. For example, the combinational logic depending on the particular application/implementation may include an adder, or a device to effect mask shifting, or the like.

For proper detection of verification of stable address (or detection of error), the address verification logic 3454 includes validation of stable conditions as a prerequisite. In the illustrated example, the following prerequisites must be met:

The source address 3450 is suitably monitored, and found to remain constant for two or more clocks. This is indicated by appropriate assertion of a source valid signal.

The adaptation logic 3451 is suitably monitored, and found to remain constant for the same two or more clocks. This is indicated by appropriate assertion of a logic valid signal.

The MUX(s) 3452 and the MUX of the S/H circuit 3453 are suitably monitored, and found to remain constant, or in some cases, found to have switched to another path maintaining the same address such as a pipelined or saved version of the address. This is indicated by appropriate assertion of a MUX valid signal.

When all such conditions are met, the addresses resulting from the stable address iterations through a given adaptation stage may be properly compared. That is, execution of comparison logic on the resulting addresses is "valid," and any transient errors may be properly detected for the stage thereby. If any of the conditions is not met, the associated valid signal is deasserted, and the address comparison check is inhibited for that clock cycle of operation. Stable address check is resumed for other clock cycles of operation, where the required conditions are met.

Preferably, these and other address protection portion measures are incorporated into pipelined stages of a conventional interface portions by suitable modification of their existing logical functions. The functional components of the generic adaptation stage 345 are described in more detail in turn below.

Source Address

The source address as used herein includes any address input to a stage of the address conversion/adaptation logic configured to execute address verification logic. In the disclosed embodiment, the source address must remain stable for two or more clocks for an address compare to be done. In certain cases, the address path may be multiplexed between the address and a captured version of the address which may also maintain the valid source address. For example, in order to maintain a valid source at the port, modifications may be needed to existing logic for proper handshake therewith, such that the same address is sent for at least two clocks. Internally, changes to existing logic may also be required to maintain internal address sources for two or more clocks.

MUX Control

The MUX control logic 3452a executes to select for a given MUX the same source address for two or more clocks, so the stable address check may validate the address path. In some cases, the given MUX may switch to a pipelined version of the same address, and the address check may remain valid. The input signal to the MUX select is preferably compared to the previous state of that signal. Where a MUX control in an adaptation stage changes between stable address iterations, the address compare is rendered invalid for the associated clock cycle of operation. Some existing MUX control logic may require suitable modification to align with the two clocks where the source address is stable, some existing MUX control logic may be suitable as is, and some MUX control logic may require no modification because the path is not significant enough to include for address protection.

Since the source address must pass through the address conversion logic for at least two clocks for the stage's conversion logic to be properly checked, switching to a pipelined version of the address for the second clock will avoid detection of error in the conversion logic since the pipelined version is just a copy of the first clock's address after conversion. The pipelined address check remains valid, but not as critical as the required conversion logic check.

S/H Control

The S/H (set and hold) control logic 3453a preferably includes a MUX select that captures and holds a source address value. Conventionally, S/H control logic typically only allows pass through and capture of an address for a single clock. For the stable address check logic disclosed herein, such control logic is preferably modified to allow the source address to pass through for at least two consecutive clocks. Once the source address has passed through for two clocks, the S/H logic may capture and hold the value, and the address remains valid as long as the address remains held.

Adaptation Logic

The combinational logic 3451 for carrying out the adaptation response of a stage (or, the stage's adaptation logic) must remain constant in operational configuration for two or more clocks for the stable address check to be valid. Suitable modifications to existing combinational logic may be required for such things as address incrementing logic and the like, such that the logic's operational configuration does not change over the clock cycles that the source is held stable. When logic's operational configuration does change during those clock cycles, the stable address check invalidated.

Address Compare

The stable address compare logic within the address verification logic 3454 executes to compare a current converted address with the converted address from the previous clock cycle. The stable address compare is valid if all of the valid criteria are met, as indicated for instance by the AND-gating of the source valid, logic valid, and MUX valid signals in the example shown. An error is indicated where the addresses do not compare, but the comparison itself is valid. Hence, the detection of that error is validated.

Next Address Stable

The next address stable signal 3455 indicates to the next adaptation stage that the current adaptation stage is sending a stable address as long as the signal remains asserted.

In one illustrative embodiment of the interface portion 3-2, the pipelined adaptation stages preferably include: Port, Port Async FIFO, User, and Split. The first three of these stages is schematically shown for illustrative purposes in FIGS. 4C-4E. The following diagram illustrates the conceptual challenges existing across these stages.

The pipelined interconnection is of suitable type known in the art. Where, for example, a 32 bit address is received, the address is typically entered in a 32 bit register. From there, the stored 32 bit addresses are passed in turn through successive adaptation stages of the interface portion 3-2. In the course of propagation through the pipelined stages, the 32 bit address may be transformed/converted to, say, a 40 bit address, with various modifications applied thereto, according to the particular requirements of the intended application. The address is thereafter passed to the command control portion 10, where it is captured before being subjected to the adaptively split addressed processing for inline storage configurations, as described in Section A.

Figure 4C:
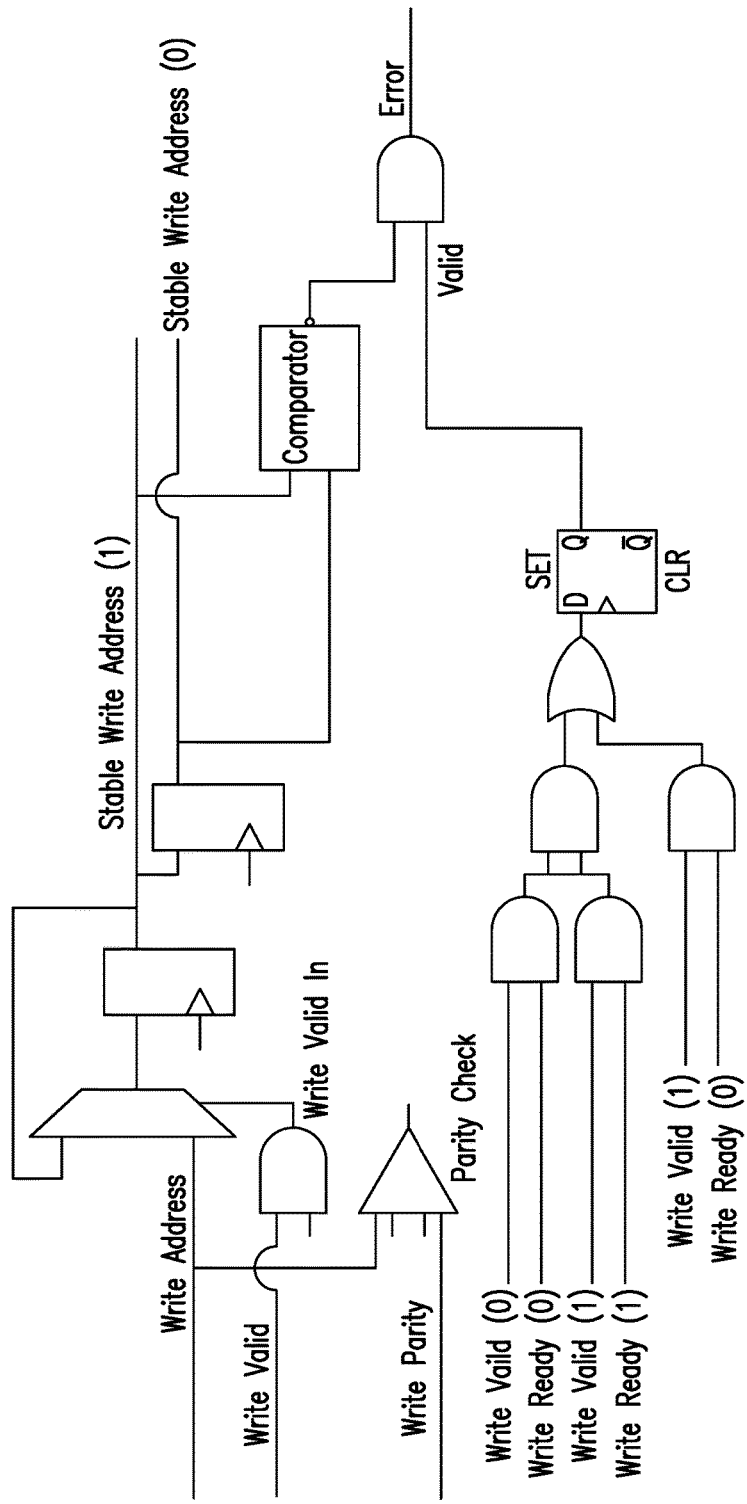
FIG. 4C is a schematic diagram illustrating one sample implementation of a first adaptation stage employed in the interface portion shown in FIG. 4, in accordance with one exemplary embodiment of the present invention.

FIG. 4C illustrates but one of numerous examples of a first adaptation stage 340-1 employed in the interface portion 3-2. In this example, the stage is implemented for instance to carry out the sample case of an AXI write memory transaction, with stable address checking. The write address is received with parity. The parity is checked and discarded in this stage; and, parity does not follow the address through the remaining address path. The write address is valid when a Write Valid signal is asserted in this example. The write address is accepted when a Write Ready signal is asserted, at which time the Write Address may update to the next value.

In FIG. 4C as in other FIGS., the illustrated signals at each of the stable address iterations are denoted by (1) and (0) indicating for purposes of explanation the signal's state/value at the current and prior iterations, respectively. In the case of stable address iterations taken over consecutive clock cycles of operation, references (1) and (0) indicate states/values at the current and immediately preceding clock cycles.

This stage is a variation on the generic stage example 345 illustratively shown in FIG. 4B. It is a sample first stage configured for a write memory transaction. The input address for this stage is not provided by a pipeline register. It is in this case the received port address. The stage employs a MUX within an S/H circuit, but employs simply a conductive interconnection in place of any particular combinational adaptation logic. Like all other stages, the stage nonetheless imparts an adaptation response (be it timing based, or otherwise) on the address propagated through its logic components. The MUX is controlled by a Write Valid In signal, which for purposes of stable address checking keeps the MUX switched to the same address select for two consecutive clocks.

To verify that the write address remains stable across two clocks, the logic in this embodiment must be able to throttle the address such that a write address is sent for a minimum of two clocks. The address may be throttled by inhibiting assertion of a Write Ready signal for those two consecutive clocks, which forces the source to maintain a stable address for a minimum of two clocks.

The signal Write Valid In reduces to Write Valid for this case.

The signal Write Ready cannot be asserted prior to Write Valid; if Write Ready is asserted on the first clock Write Valid is asserted, Write Address only drives the associated address for a single clock which prevents an address compare from being valid.

Driving the signal Write Ready low until the clock following Write Valid adds a clock of latency to an initial write command.

The signal Write Ready in this embodiment must be driven low every clock where (Write Ready & Write Valid) are in their high/on state, in order to throttle the address to be asserted at least two clocks per AXI transaction. Since each address will translate to a minimum of two commands at the command split (in the command control portion 10), this should not degrade performance.

The signal Write Valid In equals Write Valid in this case, and serves as the additional logic controlling the Write Address input MUX.

Figure 4D:
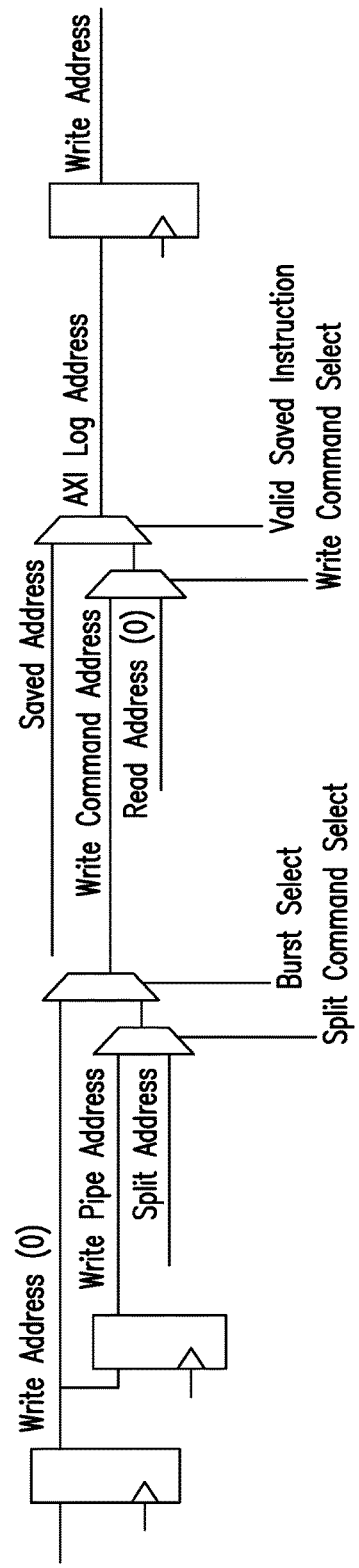
FIG. 4D is a schematic diagram illustrating one sample implementation of a second adaptation stage employed in the interface portion shown in FIG. 4, in accordance with one exemplary embodiment of the present invention.

FIG. 4D illustrates one of numerous examples of a second adaptation stage 340-2 employed in the interface portion 3-2, configured for stable address checking. Following the Write Address register, the address is placed through this adaptation stage in an AXI Async FIFO. The address is unchanged, but flows through a series of MUX's. If the MUX's are unchanged in switching state, or changed in switching state only to the extent that it provides the same address or a registered version of the address, then the address should remain the same for two or more clocks, as before. If the MUX's change in switching or other such operational configuration, the address provided thereby may change. The MUX logic is typically somewhat complex, so modifying the MUX controls will be difficult. The main requirement is to maintain the MUX control path for at least two clocks on a read and a write, such that address checking may be carried out.

This adaptation stage is also without any particular combinational adaptation logic on the path, but employs numerous MUX's whose switching is controlled to maintain consistent configuration over consecutive clocks to suit stable address checking. According to the so-called AXI standard known in the art (which is applicable to this sample case), write and read addresses are received on different interfaces. So depending on whether a read or write transaction is to be processed, one or the other of a read path or a write path is selected. This is apparent from the Write Address signal being received through one path and the Read Address signal, being received through another path. So the sample command signals for the different MUX's shown are suitably controlled in the illustrated case to select command consistent with a write command. Control of these MUX's is preferably maintained to preserve the selected write path consistently for the two or more clocks sufficient to support stable address checking, while also holding the Write Address signal stable for those clocks. For this particular stage, the comparator and other components of the address verification logic such as shown in FIG. 4C is preferably included, but not shown in the interests of clarity and brevity.

The resulting Write Address signal is valid for compare when it is held stable for the two consecutive clocks of this example, and the MUX selects have been held stable over those clocks. Regarding the MUX controls, the respective control signals are preferably set to clearly define when the source address is stable during the relevant clocks, or otherwise modified to remain stable during the relevant clocks.

Figure 4E:
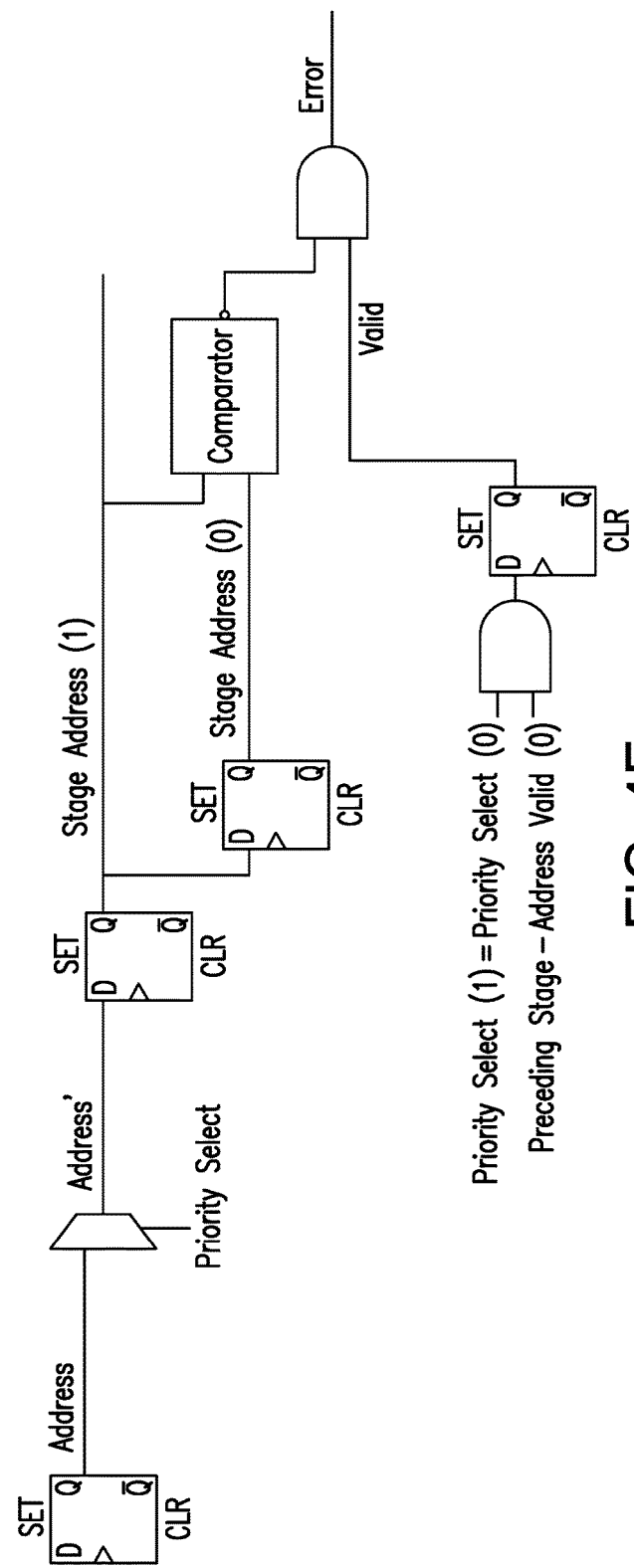
FIG. 4E is a schematic diagram illustrating one sample implementation of a portion of a third adaptation stage employed in the interface portion shown in FIG. 4, in accordance with one exemplary embodiment of the present invention.
Figure 4F:
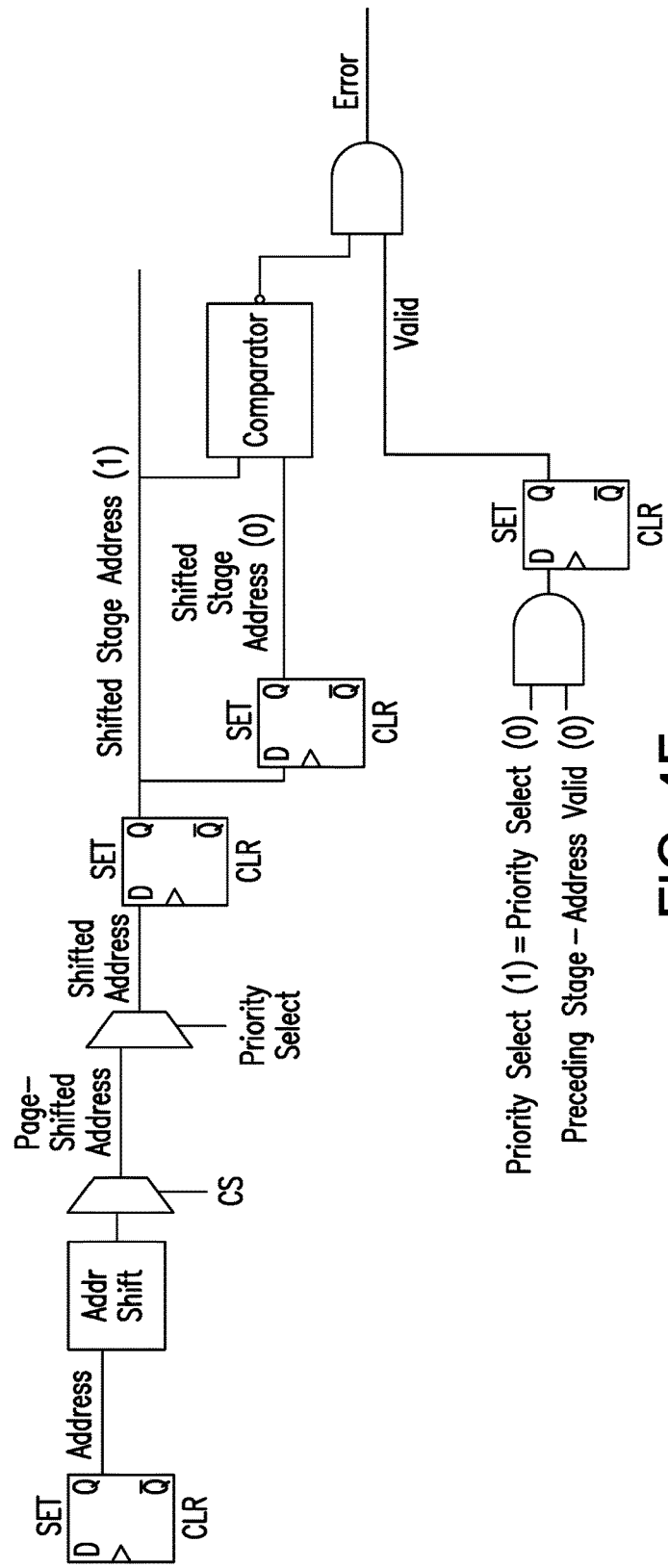
FIG. 4F is a schematic diagram illustrating one sample implementation of another portion of a third adaptation stage employed in the interface portion shown in FIG. 4, in accordance with one exemplary embodiment of the present invention.

FIGS. 4E-4F illustrate different functional paths defined for different address segments in one of numerous examples of a third adaptation stage 340-3 employed in the interface portion 3-2, configured for stable address checking. Following the AXI Async FIFO stage of FIG. 4D, the write address in the sample case shown is passed to the next stage to be captured through either a suitable port concentrator or address map module. The address path through the port concentrator is preferably formed by a MUX selected by a port concentrator arbiter signal Priority Select. The arbiter is suitably modified as necessary to select the same port for the two or more clocks required for stable address checking. This must be while the address is valid and stable, as indicated by the by the inputs to the AND gate of the stable address verification logic shown for this stage. In this case, valid address is indicated by the signal Address Valid (0) from the preceding adaptation stage; and, address stability is indicated by the Priority Select (1) and Priority Select (0) signals for the two consecutive clocks remaining the same.

As shown in FIG. 4F, other segments of the address go through address shift logic in this stage. The address shift is combinational logic that preferably remains consistent from clock to clock. An additional MUX is added to the path (as compared to the stage implementation of FIG. 4E) for selecting a target chip select (via a CS control signal) which must be timed consistent with the Priority Select signal of the other MUX, and the like.

The Stage Address (1) and Stage Address (0) signals represent registered version of the address as captured by the stage upon propagation therethrough over the two consecutive clocks. Upon propagation during the first clock cycle, the resulting address is stored, in addition to being passed on through. On propagation through the stage during the next clock cycle, if the stored address is of the same value as that of the preceding clock cycle, nothing has failed. Otherwise, the comparator indicates occurrence of an error, so long as the stable address is validated by the other portion of the verification logic shown. That is, if all the stable condition requirements have been met, a valid compare is thereby indicated, and the comparator output of error/no error is taken as such by the system for suitable processing in accordance therewith.

With reference to the different paths defined by FIGS. 4E and 4F, the address is decomposed to the extent that different segments of the address (such as the chip select segment in the example shown) go through different logic before being recomposed. Different parts of the address may be separately transformed in this manner, then pulled back together for passage of the transformed address to the command control portion 10.

Within the command control portion 10, the address is subjected to split-addressing in connection with the split-command processing in accordance with an inline storage scheme. As part of the split command processing, the address is transformed into several versions of the address as required for each of the split commands generated as part of the command sequence. These transformations include significantly more combinational logic and MUX logic than other stages of the address conversion logic.

In comparing the stable address integrity checking and conventional parity checking, the stable address integrity checking approach removes the complexity of address translation logic. As noted, stable address integrity checking preferably sends the same address for two or more clock cycles, while sustained address parity checking operates on a single clock of address and requires compensation of parity through the address translation logic.

Figure 4G:
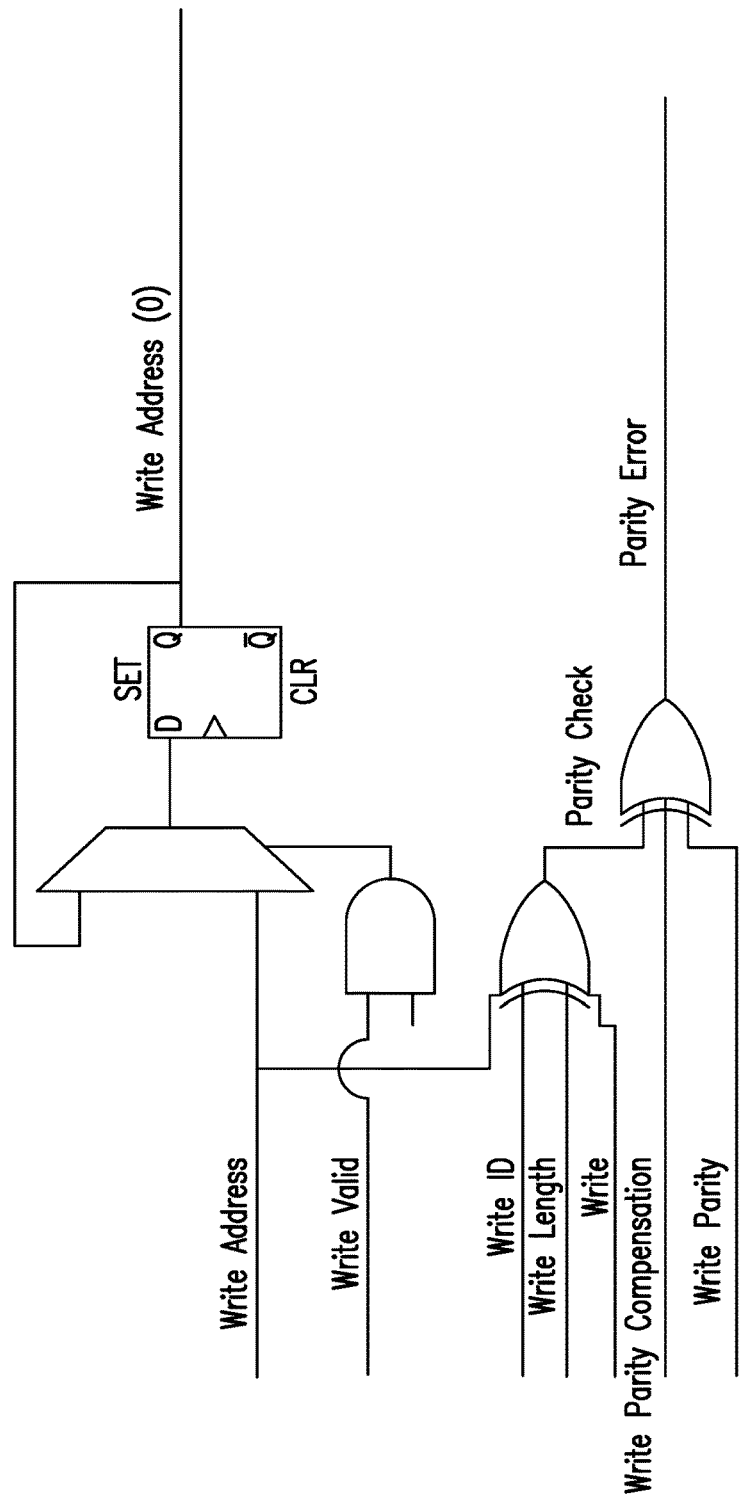
FIG. 4G is a schematic diagram illustrating one sample implementation of a parity check circuit employed in a portion of the interface portion shown in FIG. 4, in accordance with one exemplary alternate embodiment of the present invention.

Notwithstanding such added complexities of carrying address parity through an adaptation stage of the interface portion 3-2, one or more integrity control sections 360-1-360-n in certain alternate embodiments may implement a parity check through the associated adaptation stage(s) 340-1-340-n, where suitable for the intended application. In such alternate embodiments, the given integrity control section is configured as a parity check portion coupled to at least one adaptation stage. The parity check portion includes a parity adaptation section that executes to suitably replicate and apply the adaptation response of the adaptation stage on a parity bit of an input address. The parity check portion includes a check circuit of any suitable type known in the art to check for parity error. One example of such check circuit is schematically illustrated in FIG. 4G. Where a subsequent adaptation stage implements a stable address check, the parity bit is removed from the address for passage to the next stage.

Section A. Adaptively Split Addressing for Inline Memory Storage

In an exemplary embodiment and illustrative application, the memory controller system is configured to control a memory device formed by a plurality of independently accessible/selectable integrated circuit (IC) chips, wherein one or a group of chips (enabled by the same chip select CS) of the memory device each defines a plurality of banks. Each bank is preferably organized in illustrative applications with its storage cells arrayed in rows and columns, with each row of storage cells of that bank preferably forming an individually accessible page of cells. Each selectable chip defines at least one selectable rank. In certain cases, a physical chip is suitably configured with multiple distinct storage units (such as front and rear sides of a double sided memory structure, or different stacked components of a 3DS stacked memory structure) respectively defining multiple, independently accessible/selectable ranks. Except to the extent their distinction is made applicable by the structural makeup of a given memory device, the terms chip and rank are used synonymously herein. Unless otherwise indicated, a chip or rank may be referred to herein by shorthand reference to the chip select (CS) designations by which they are addressed.

Depending upon its type and class, known memory devices typically define between 2 to 16 banks of memory. The banks of different devices are sized with widely varying numbers of pages, though typically ranging from $2^{12}$ to $2^{18}$ pages of memory cells within each bank. In a typical DRAM memory device, only one page may be open at a time within each of its banks. Thus, in an 8-bank device, as many as 8 unique pages may be open at any given time, one page in each bank. To gain access to a different page within the same bank, the currently open page must first be closed before that different page may be opened.

In an exemplary embodiment and illustrative application, the memory controller is of a type suitably configured for Error Correcting Code (ECC) or any other such error checking techniques known in the art for error detection and/or correction employing designated error detection/correction bits (collectively referred to herein for brevity as "ECC," unless specifically noted otherwise). Each ECC-protected data word is stored with additional ECC bits set according to a predetermined ECC format of suitable type (such as the so-called SECDED, or Single-Error Correcting and Double-Error Detection, type commonly used in the art).

During operation, the disclosed memory controller supports one or more control, or user application, operations executed on a central processing unit or other main controller (collectively referred to herein as 'master' operations or 'master' control operations), providing the memory storage and access needs of such master control operations. When data is written to memory for storage and later read out as prompted by a master control operation, ECC enables the memory controller to detect the occurrence of 'soft' errors in the data as stored—namely, those errors which cause a 'flip' of a bit value as the result of interference, radiation, or other such source of random error.

As noted, memory controllers in numerous conventional applications are configured for storage of ECC-protected data in the sideband ECC storage format/configuration. FIG. 1 schematically illustrates one example of such sideband storage, where a data word is defined by 72 total bits segmented into eight (8) bytes of data and one (1) byte of ECC associated therewith, each data/ECC byte being formed by eight (8) digital bits. As with other schematic views herein, FIG. 1 is view is shown for explanatory purposes and without regard to points of detail such as relative scales, precise interconnections, and the like. FIG. 1 illustrates just one of numerous examples, and ECC-protected data words may have any other suitable byte/bit length definitions for data words known in the art.

As shown, the sideband storage shown is supported by a memory device formed to include at least nine (9) selectively addressable chips: eight chips (CS0-CS7) for each data byte of a data word, one chip (CS8) for the associated ECC byte of the data word. Each chip CS0-CS8 defines a plurality of banks $B_0$-$B_n$. The eight 8-bit data bytes of a data word are then stored in parallel in their respectively designated data chips (CS0-CS7), starting at the same bank and row/column addresses within their designated chips. The corresponding ECC byte of the data word is likewise stored effectively in parallel with the data bytes. The ECC byte formed by eight ECC bits associated with the eight data bytes are stored beginning at the same matching bank and row/column addresses within the designated ECC (or sideband) chip(s) (CS8). Memory transactions such as those for carrying out read, write, read-modify-write, and masked write operations may then be commanded with the same address applied concurrently for both the data bytes and their sideband-stored ECC bytes with respect to their respective chip selects.

In contrast, an inline approach to storing data and ECC bytes supported and enabled by the disclosed memory controller system provides for the systematic storage of ECC bytes along with data bytes, even when the available memory device is not adequately equipped or configured for such sideband storage of the ECC bytes. That is, the memory controller system provides adaptively for storage of the ECC bytes along with the data bytes in one or more of the chips available on a given memory device. That is, the ECC bytes are stored inline with the data bits, sharing memory space within one of more common chips with the data bytes. In certain exemplary embodiments and illustrations, for example, a portion of the memory storage locations available on a chip may be allocated for data bits and the remainder allocated for ECC bits. The available memory device chips may be shared for data and ECC bit storage according to a wide range of memory space configurations depending on such factors as data word size, the number and layout of available storage cells, and the like.

FIGS. 2A-2B illustrate one example of the numerous ways in which an inline storage configuration may be implemented to suit the particular requirements of the intended application. In this example, a 72-bit data word is again employed, but with a memory device having just the eight chips CS0-CS7 available to provide the memory space, without the benefit of a ninth dedicated sideband ECC chip. In the interests of brevity and clarity, the storage of data and ECC bytes with reference to one bank, namely bank B0, of the chips CS0-CS7 is schematically illustrated. As shown, the available memory space of each chip is sectioned according to a predetermined data-to-ECC ratio. In the illustrated case, a data-to-ECC ratio of 8 to 1 is employed with DRAM chips CS0-CS7, such that $7/8^{th}$ of each chip's available memory space is dedicated for data bits, while $1/8^{th}$ of the memory space is dedicated for ECC bits. In this sense, the available memory space is logically 'partitioned' to store ECC bits in that part of memory not accessible for storage of data bits. These dedicated partitions, or sections/regions, of memory storage cells may be selectively defined at mutually offset locations in terms of pages and/or banks within a shared chip select.

Although other ratios may be employed depending on the requirements of the particularly intended application, the 8-to-1 ratio provides for convenient mutual offsetting of addresses between data and ECC bits stored on the same chip. Adding three digital high values (111) and shifting a row address by 3 bits, for instance, provides a binary divide-by-8 effect for mapping ECC bits to a consistently offset storage address relative to their corresponding data bytes.

FIG. 2B schematically illustrates the physical storage scheme for the data and ECC bytes making up a set of data words. Memory data is transmitted for various applications in bursts containing numerous data words, and this set of data words may, for instance, constitute the data words of the same burst. In the case of data bytes, the eight data bytes of each data word in this example are physically stored in suitable manner across matching cells of the available chips for convenient logical addressing. Since eight chips CS0-CS7 are in fact available in the illustrated example, the 8-bit data bytes making up each data word are stored beginning at parallel/matching bank, row, and column locations across the chips CS0-CS7, much as in the sideband storage case illustrated in FIG. 1. The set of data words shown—namely, data words A (formed by constituent data bytes $A_7$, $A_6$, $A_5$, $A_4$, $A_4$, $A_2$, $A_1$, $A_0$, in most significant to least significant byte sequence), B, ..., H (formed by data bytes $H_7$-$H_0$)—are each stored this way within the data section of the given bank.

For example, data bytes $A_7$-$A_0$ of data word A are each stored in the respective chips CS7, CS6, CS5, CS4, CS3, CS2, CS1, CS0 at the same matching bank $B_0$, row, and column locations. The data bytes of the next data word B are likewise stored in the respective chips CS7-CS0 at the same matching bank $B_0$, row, and column locations, but one columns location over from the data bytes of the preceding word A. The data bytes of the other sample data words C-H are similarly stored at matching bank, row, and column locations, successively located one column over from the preceding data word's data bytes.

As for the 8-bit ECC bytes $A_{ECC}$, $B_{ECC}$, $C_{ECC}$, $D_{ECC}$, $E_{ECC}$, $F_{ECC}$, $G_{ECC}$, $H_{ECC}$ generated by the memory controller system for the eight data words A-H, they are physically stored in this example starting preferably from the same chip, bank, and column location aligned with the first stored data byte of the data word A (of the given burst), but offset in row location from that data byte so as to be disposed in the adaptively established ECC section of the given bank. The ECC bye of the next data word B is then stored in the same bank of the next chip over, at the first available column location (which matches the column location aligned with the data byte of the first data word), but offset in row location so as to be disposed in the ECC section of the given bank of the given chip. The ECC bytes of the remaining data words C-H are similarly stored at corresponding locations in successive ones of the other chips as shown. In certain applications, the bank location within the same chip may be offset as well, so as to optimize performance, since rows/pages of a given bank in many applications may only be opened one at a time.

FIG. 2A schematically illustrates a logical storage scheme reflecting the physical storage scheme shown in FIG. 2B. In this example, no bank offset is employed between the inline-stored data bytes and their associated ECC bytes. Hence, when the distributed contents of bank $B_0$ across the chips CS0-CS7 of FIG. 2B are combined in the collective bank $B_0$ as shown, the data words A-H are effectively stored in successive 64-bit cells within a row of the data section defined in the collective bank $B_0$. The eight 8-bit ECC bytes $A_{ECC}$-$H_{ECC}$ associated with those data words A-H are stored in the 64-bit cell mutually offset from the data word A, so as to be disposed in the ECC section defined in that collective bank $B_0$. Inline storage may progress in this manner with the data and ECC bytes of the next set of data words.

Figure 3A:
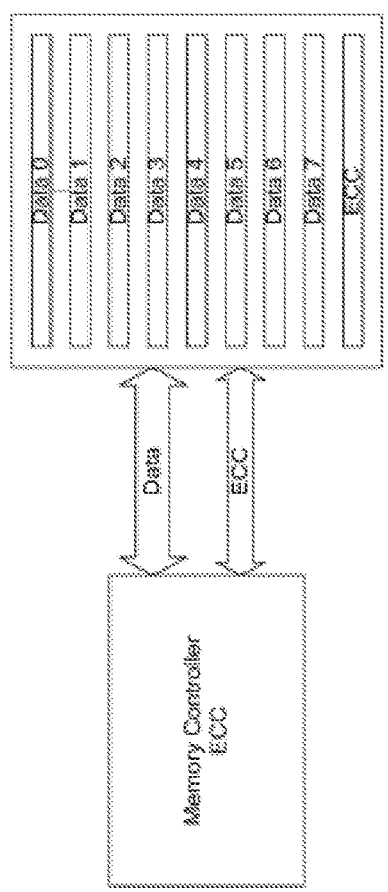
FIGS. 3A-3B are schematic diagrams comparatively illustrating differing aspects of memory control interface with a sideband storage scheme and with an inline storage scheme for data and error checking components of error-protected data words in a memory device.
Figure 3B:
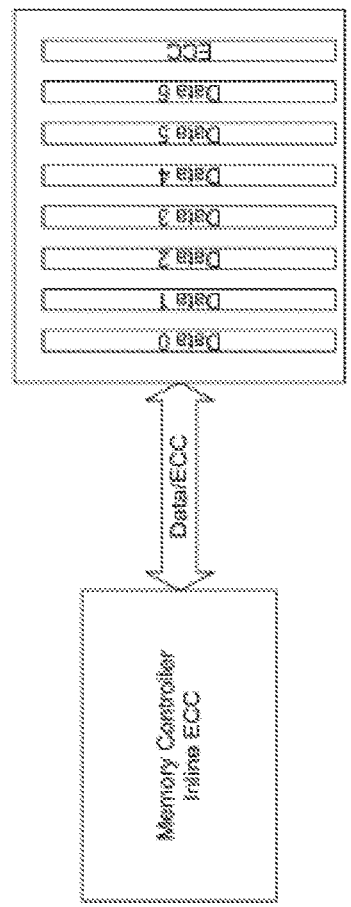

FIGS. 3A-3B more conceptually illustrate the differences between sideband and inline approaches to storing data and ECC bytes. In the sample implementation shown, the sideband ECC approach of FIG. 3A stripes a single data word (again, 64-bits of data or 8 bytes) plus ECC (8-bits or 1 byte) across a single 72-bit data bus interface. With inline ECC approach of FIG. 3B, the topological requirement for additional sideband ECC memory alongside data memory is removed, and an ECC byte is stored inline with the data byte at a different location in memory. The memory capacity overhead may be similar in both cases; however, the ramifications for memory operations, functionality, and performance are significant in practice.

Such inline storage of ECC bytes with their data bytes offers an attractive, reliable alternative where, despite the benefits of its simplicity, sideband storage of ECC-protected data is not viable. The memory device(s) actually available for storage may not be adequately equipped to support such sideband storage of both data and ECC bytes in all applications. As noted, form factor, memory technology, cost, and other prohibitive factors may not permit the allocation of a dedicated chip(s) for ECC byte storage that sideband storage normally requires, though the unmitigated need for error-protection of the data words in the memory transactions persists.

Figure 5:
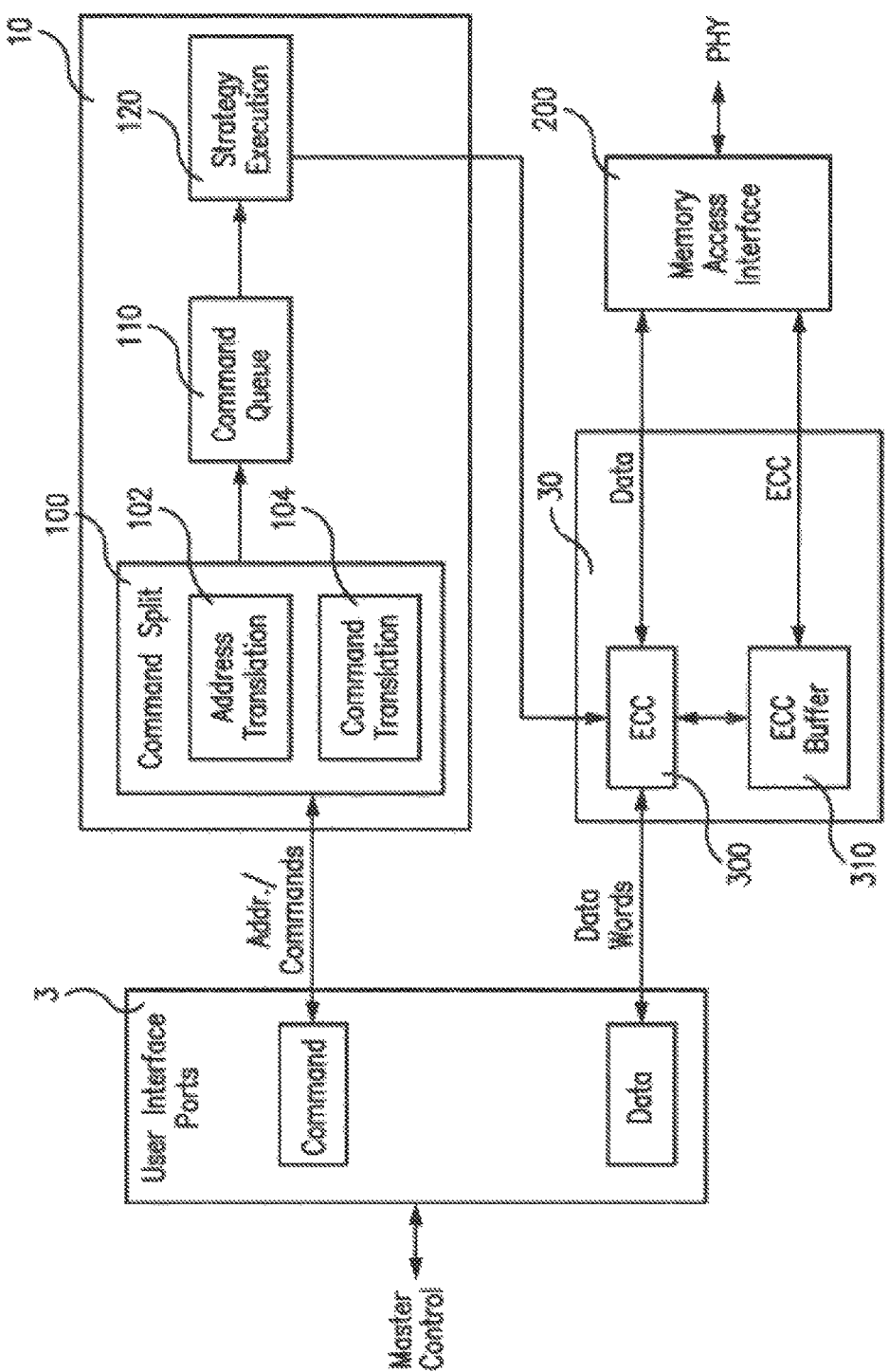
FIG. 5 is a schematic block diagram showing certain portions of the system embodiment of FIG. 4, illustrating intercoupling with certain subsystems in one illustrative application.

Referring to FIG. 5, there is shown a schematic diagram illustrating the intercoupling of certain functional units for carrying out the adaptation to inline ECC storage configurations in the memory controller system 1 (such as illustrated in FIG. 4), as formed in accordance with one exemplary embodiment of the present invention. In the interests of brevity and clarity, only certain parts (units/modules/sections) of the overall memory controller system 1 are schematically shown. The functional units are each shown in the disclosed embodiment implemented as parts of certain command control, data control, and error control portions 10, 20, 30, but each functional unit may be suitably implemented as part of a different system portion in alternate embodiments, depending on the particular requirements of the intended application.

In FIG. 5, only those parts of the overall command control portion 10 pertaining to the adaptation of memory controller system 1 for inline ECC storage are illustrated. Other parts of the command control portion 10, as well as of the other portions 20, 30 of the memory controller system 1, which are not shown or specifically described may be of any suitable type known in the art configured to suit the particularly intended application. The particular details of such other parts and portions will be apparent to those skilled in the art.

In accordance with certain aspects of the present invention, the command control portion 10 of the memory controller system 1 incorporates an adaptation capability that is integrated to the extent practicable to make use of the memory controller system's other conventional capabilities. This includes known memory controller systems' use of control and execution logic for ECC, address shifting between user and memory-specific addresses, and address/command generation for data words.

In the exemplary embodiment and application illustrated, the master control operation issues memory transactions in the form of commands for certain data words to be operated on and the addresses for those data words. These addresses and commands are typically received in the master control operation's formatting by the command control portion 10 through the user interface ports 3. When such addresses and commands are received, the command control portion 10 executes to among other things determine the proper memory access addresses respectively for the data and ECC components (upon generation or upon retrieval from memory) of the data words in question. Based on the resulting data and ECC access addresses, the received commands are split to generate a sequence of multiple commands, at least one for the data component, and at least one for the ECC component. The data address is suitably translated to generate separate, mutually offset data and ECC access addresses, which correspond to separate commands for the data and ECC components of the data words in question. The translated addresses are compatible with the particular inline storage configuration employed, with the data and ECC components sharing the memory space available on the chips of the given memory device 5.

The data words of memory transactions in questions are passed within the memory controller system 1 to the error control portion 30. The error control portion 30 includes an error correcting unit 300 preferably implementing a suitable error detection and correction technique employing an ECC known in the art, of predetermined format. The error control portion 30 also includes an error storage unit 310, which in the embodiment shown is implemented in the form of an ECC buffer. During write operations of the memory transactions, associated ECC components are generated for the data words received from the master control operation through the user interface ports 3 by the error correcting unit 300. The ECC components of the data words are intermediately stored in the ECC buffer 310 until accumulated for all data components of the given write operation. When drawn from the ECC buffer 310 thereafter, the associated ECC components and the data components emerging from the error correcting unit 300 are at that point addressed separately and subjected to separate write commands for mutually offset inline storage in the memory device 5. They are passed to one or more suitable memory access interface units 200 (of the data control portion 20) for passage to the PHY.

During read operations of the memory transactions, the separately addressed data and ECC components of the data words are read through separate read commands from their mutually offset inline stored locations in the memory device 5, responsive to the translated data and ECC addresses and commands received for execution from the command control portion 10. The data components read from the memory device 5 are passed through the memory access interface units 200 to the error correcting unit 300, and the associated ECC components read from the memory device 5 are passed through the memory access interface units 200 and intermediately stored in the ECC buffer 310 until the data components of the given read operation are read and ready for error check. The ECC components are then passed from the ECC buffer 310 to the error correcting unit 300 for error checking of the associated data components. The checked (and possibly corrected) data words are returned to the master control operation through the user interface ports 3.

Turning in more detail to the command control portion 10, the portion includes in the illustrated embodiment a command queue unit 110 which receives commands generated by a command split unit 100, and from which a strategy execution unit 120 draws commands for timely execution. The command queue unit 110 receives and registers commands from not only the master control operation (through user interface ports 3 and command split unit 100), but also from other functional units not shown. Depending on the particular application, these include for example a built-in-self-test (BIST) unit, a scrubbing engine, and the like. The command queue unit 110 receives and queues up the respective data and ECC commands translated by the command split unit 100 from the command received from the master control operation.

In accordance with certain aspects of the present invention, the command split unit 100 implements the functional logic for restructuring and modifying the commands and associated addresses it receives. The unit provides the necessary translation of incoming addresses/commands for data words to adaptively suit inline storage of associated ECC and data components in the available memory device 5. The command split unit 100 thus includes an address translation section 102 and a command translation section 104. The address translation section 102 executes to apply a predefined mapping scheme to the data address received in user addressable space, and map to separate addresses in memory addressable space for the data component and for the ECC component (generated or retrieved in the memory controller system 1) of each data word. This address translation to obtain separate data and ECC access addresses is preferably carried out in addition to existing address conversion measures generally for data accesses, by which address is transformed to an address defined in terms of device-specific address parameters of the given memory device (to reflect the row, column, page, or other such storage cell arrangement/organization thereof).

As noted herein, communications traffic in the illustrated embodiment includes commands and data which are preferably transmitted in burst mode for heightened data throughput. Among other things, the command split unit 100 preferably executes to enforce a predefined burst limit (set to a burst limit of one in the illustrated embodiment) for each command entered in the command queue unit 110. The unit preferably also executes to confirm acceptance of each command entry which satisfies the burst limit condition.

The command translation section 104 executes to evaluate incoming commands to determine if they include a read, write, or read-modify-write data access operation based on address, length, and availability of data masking. The received commands are further evaluated to determine if the associated ECC access of the command includes a read, write, or read-modify-write operation based on similar criteria applicable to the ECC access. Based on such determinations, the received commands are split, or decomposed, into corresponding command sequences. For inline ECC storage, the sequences include additional ECC read and/or write commands that are suitably generated as required from the received commands. The command translation unit implements suitable logic to split incoming commands accordingly into the appropriate set of data commands and generate their associated ECC commands—such as reads, writes, and read-modify-writes. Suitable command placement measures are preferably implemented in the command queue unit 110 to ensure that these command sequences containing matched data and ECC commands are executed as in-order sequences that cannot be interrupted by other commands.

The command control portion 10 preferably includes as well a strategy execution unit 120 coupled to the command queue unit 110. The strategy execution unit 120 implements the functional logic to selectively direct command entries accepted into the command queue unit 110 to corresponding parts of the error control and data control portions 20, 30 for timely execution thereby. The strategy execution unit 120 serves in the meantime to hold the accepted command entry under execution. It preferably issues the accepted commands of the command queue unit 110 burst by burst.

As noted herein, the memory controller system 1 preferably accommodates 3DS device applications. In these applications, the memory device(s) is configured with a stacked device structure having at least one multi-level stack of component chips, where for instance each selectable chip stack (addressed by a corresponding CS) includes one or more selectable chips addressed by a corresponding chip identity (CID). A 3DS memory device thus necessitates an additional decode field in the address for the CID, which selects a particular sub-device within a stack, all sub-devices within a stack (2, 4, or 8 sub-devices) defining a single chip select (CS). For inline ECC address decoding, the ECC boundary for 3DS devices is preferably defined on a CS boundary (as opposed to a CID boundary).

The CID bits are combined with the upper Row bits as required to create a 3-bit ECC data storage address range and cross over point to the next CS. Since for 3DS, the CID bits are disposed at the top of the address, the CID bits constitute the MSB bits for the 3-bit decode used to define the ECC address space. The remaining bits of the 3-bit address are filled in according to the necessary number of top Row address bits. The CID may span 1, 2, or 3 bits, so the necessary Row address bits may be 2, 1, or 0 respectively. This means that the ECC is necessarily stored in the upper CID. Consequently, data and ECC are generally not stored in the same CID except for the fraction of the upper CID memory that is not used for ECC. The timing is not significantly different when accessing the same CID verses a different CID in typical applications, so the performance impact of storing ECC in this manner tends to be minimal.

Certain of the features as preferably incorporated by exemplary embodiments of the memory controller system 1 shown are described in greater illustrative detail as follows.

Address Mapping/Translation

In order to provide a contiguous address space, the ECC memory storage is preferably mapped out of the user address space. With the memory space available in the memory device 5 logically partitioned as disclosed in the illustrated embodiment, the ECC bits are stored in the upper $1/8^{th}$ region of the memory space within each chip select of the device. As the ECC storage space in this dedicated region fills, the addressing is preferably configured to roll-over from one chip select to the next on a non-power-of-2 boundary. Suitable measures may be necessary in certain applications to reconcile non-power-of-2 memory devices to the address granularity needed to support inline ECC storage (requiring in this example decoding of the upper 3-bits in the address within each chip select).

Preferably, ECC bit storage is done on a per chip select (CS) basis, such that when the upper 3-bits of the address within a chip select are set to 3'b111 (that is, the 3 binary MSB's are set to the values: 1 1 1), the address points to a location within the partitioned ECC region of the memory space. All other addresses point to location within the data region of the memory space outside this partitioned ECC region. The user memory decode rolls over to the next chip select when the $7/8^{th}$ boundary is crossed, and for systems with more than 2 chip selects, the boundary preferably requires similar decoding at each boundary—$14/8^{th}$ boundary, $21/8^{th}$ boundary, etc. Inline ECC storage preferably involves translation of the user address to memory device address which goes beyond just masking, splitting, and/or concatenation of user address bits, as the user address for a specific CS may start at a non-power-of-two page address to avoid gaps in the user address space.

Inline ECC storage preferably also involves one or more ECC memory accesses for each user initiated command. The address and length of the ECC memory accesses are suitably computed from the user address and length. This entails translation of the row address, column address, datapath address, and chip level CID (for stacked 3DS devices). The bank address is typically not changed, unless a suitable bank offset is selectively enabled for optimized performance.

Figure 6:
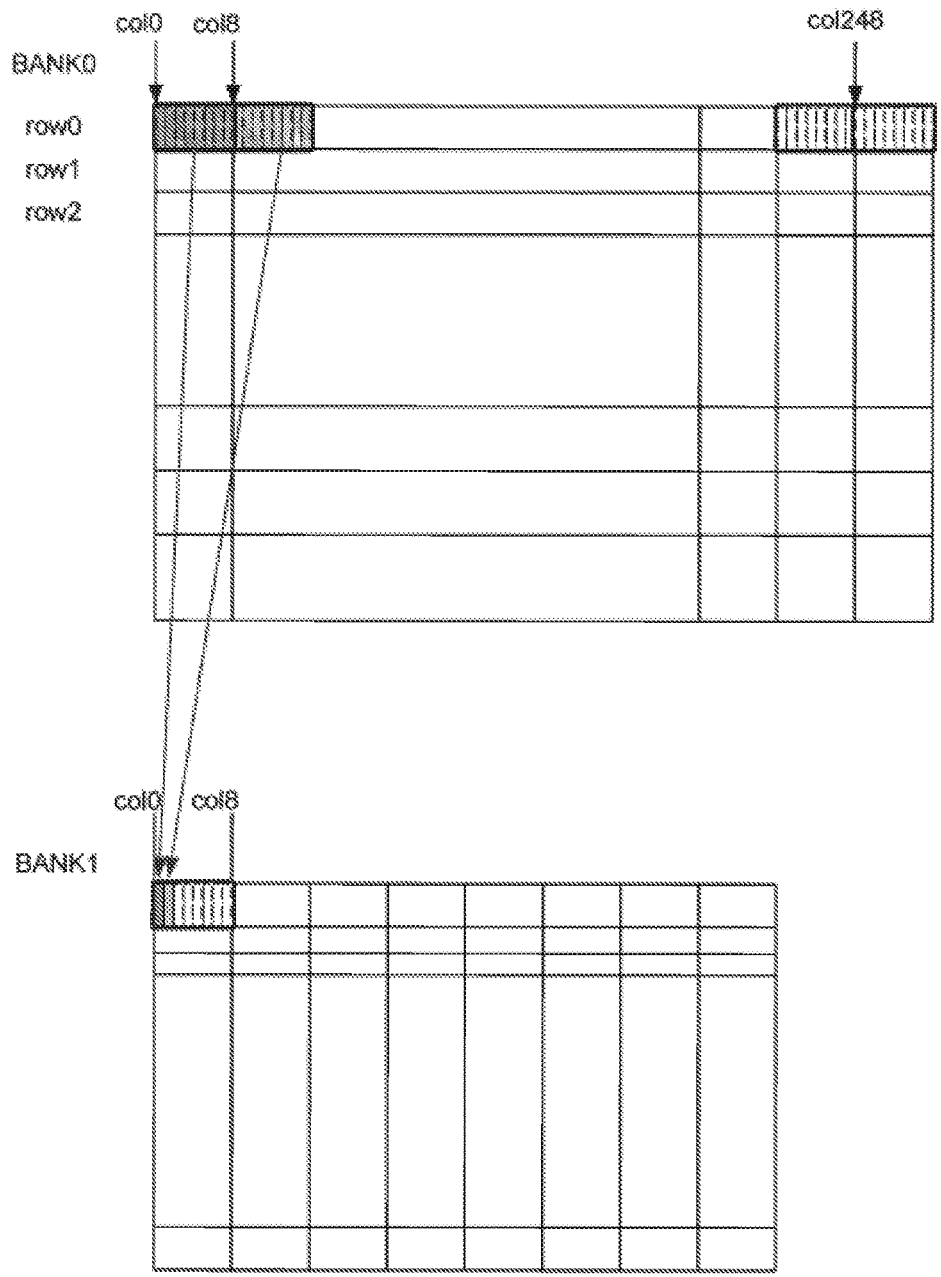
FIG. 6 is a schematic diagram illustrating a mapping of a data address of a data word received for a memory transaction to an inline storage access address for error checking components of a data word in the embodiment of FIG. 4.

FIG. 6 schematically illustrates the new address computation involved in translating from the received data address (which in this example remains the inline address for the data) to an inline address for the ECC bits of the given data word. In this schematic illustration, the ECC bit associated with the first 8-bit data byte (of the 8 total data bytes) for the data word is mapped as the first of the 8 bits making up the ECC byte for the data word at a different row address. In this example, bank offset is enabled, such that the ECC byte is stored in a different bank from its corresponding data bytes. As indicated by the arrows, the ECC bit associated with the next of the 8 data bytes for the same data word is accordingly mapped as the next one of the 8 bits making up the same ECC byte.

In this manner, the ECC bits associated with the data bytes of a given data word are stored at select locations—within the upper $1/8^{th}$ of the row address space, for example—with either the same CS and bank, or with shifted bank (if bank offset is enabled). An index is preferably computed from the row, column, and data path. All addresses with the 3 MSB bits set to 3'b111 are thereby reserved in this illustrative example for inline storage of ECC bits.

Bank Offset:

For Inline ECC using the ECC address translation of the illustrated example, the data and ECC naturally align to the same bank, different row. This yields row contention within the bank, since normally at most one page (typically defined by a row) may be opened at any given time within a bank. This would require opening and closing pages when switching back-and-forth between ECC and data commands that need to remain atomic, in-order, operations. To prevent this inherent inefficiency, enabling a bank offset places the ECC and data bytes of the same data word in different banks (preferably of the same chip select).

Example 1: Inline ECC Partitioned Address Mapping

In this example, the system user data address width is 32 bits, and is split into the fields/values shown below, with the following sample conditions:
- The MAX numbers of ranks configured is 2, requiring 1 CS bit.
- The system is interfacing to both ranks.
- Configured address order is: CS, ROW, BANK
- The remaining address field MAX and actual bits per field are as defined in the following table.

| Address Field | MAX | ACTUAL |
|---|---|---|
| Data path | 3 | 3 |
| Column | 10 | 10 |
| Row | 15 | 15 |
| Bank | 3 | 3 |
| Chip Select | 1 | 1 |

FIG. 7 illustrates an example of an incoming user address with respect to Example 1. The lowest user addresses are mapped to CS0. The next highest contiguous user addresses are mapped to CS1. Inline ECC storage is configured to store ECC bytes of data words in $1/8^{th}$ of the address space of both CS0 and CS1. CS0 is organized to start at user address location 0000_0000_. . . and cover up to location 0110_1111_. . . since the MSB of the row address bits will only go up to "110" instead of "111" like non-inline ECC power-of-2 memories. CS1 is therefore configured to begin at location 0111_0000_. . . , to avoid having a hole in the user address space.

| |
|---|
| 1111_1111_1111_1111_1111_1111_1111_1111 |
| Out of range |
| 1110_0000_0000_0000_0000_0000_0000_0000 |
| |
| 1101_1111_1111_1111_1111_1111_1111_1111 |
| CS1 |
| 0111_0000_0000_0000_0000_0000_0000_0000 |
| |
| 0110_1111_1111_1111_1111_1111_1111_1111 |
| CS0 |
| 0000_0000_0000_0000_0000_0000_0000_0000 |

User address 0111_0000_. . . represents CS1's location 0, so a translation must occur in the row address and chip select, since the row address is not 000_0000_0000_0000, and the CS is not 1. The following table illustrates samples of user addresses and how they are mapped to memory addresses (CS, ROW, BANK, COL, Datapath) for this example.

| | 31 CS | 31    30 ROW    16 | 15 BANK 13 | 12 COLUMN 3 | 2 Data Path 0 |
|---|---|---|---|---|---|
| #1.1 | | | | | |
| User | 0 | 000_0000_0000_0000 | 000 | 0_0000_0000 | 000 |
| DRAM | 0 | 000_0000_0000_0000 | 000 | 0_0000_0000 | 000 |
| ECC | 0 | 111_0000_0000_0000 | 000 | 0_0000_0000 | 000 |
| #1.2 | | | | | |
| User | 0 | 010_0000_0000_0000 | 000 | 0_0000_0000 | 000 |
| DRAM | 0 | 010_0000_0000_0000 | 000 | 0_0000_0000 | 000 |
| ECC | 0 | 111_0100_0000_0000 | 000 | 0_0000_0000 | 000 |
| #1.3 | | | | | |
| User | 0 | 110_1111_1111_1111 | 111 | 1_1111_1111 | 111 |
| DRAM | 0 | 110_1111_1111_1111 | 111 | 1_1111_1111 | 111 |
| ECC | 0 | 111_1101_1111_1111 | 111 | 1_1111_1111 | 111 |
| #1.4 | | | | | |
| User | 0 | 111_0000_0000_0000 | 000 | 0_0000_0000 | 000 |
| DRAM | 1 | 000_0000_0000_0000 | 000 | 0_0000_0000 | 000 |
| ECC | 1 | 111_0000_0000_0000 | 000 | 0_0000_0000 | 000 |
| #1.5 | | | | | |
| User | 1 | 000_0000_0000_0000 | 000 | 0_0000_0000 | 000 |
| DRAM | 1 | 001_0000_0000_0000 | 000 | 0_0000_0000 | 000 |
| ECC | 1 | 111_0000_0000_0000 | 000 | 0_0000_0000 | 000 |
| #1.6 | | | | | |
| User | 1 | 101_1111_1111_1111 | 111 | 1_1111_1111 | 111 |
| DRAM | 1 | 110_1111_1111_1111 | 111 | 1_1111_1111 | 111 |
| ECC | 1 | 111_1011_1111_1111 | 111 | 1_1111_1111 | 111 |
| #1.7 | | | | | |
| User | 1 | 110_0000_0000_0000 | 000 | 0_0000_0000 | 000 |
| DRAM | | OUT OF RANGE ADDRESS | | | |
| ECC | | | | | |

These address translations illustrate that the CS bit and the most significant three row bits of the memory address may not always equal the corresponding user address bits. The memory controller system 1 is equipped with suitable logic to handle this translation and updates to any calculations such as the next CS or next page to carry out the necessary inline ECC partitioned memory address translation. However, the bank, column, datapath and all row bits except the MSB, MSB-1 and MSB-2 will equal the user address and require no translation, as they point to data storage regions of the chip selects. The memory controller system's existing logic to convert a user address to an internal controller address (for filling in 1's in unused bits when necessary) preferably remains unchanged.

Furthermore, ECC address translations illustrate that the most significant three row bits of the DRAM address are fixed to 3'b111 for the ECC storage. The CS and the bank may remain unchanged from the data address (again, unless bank offset is enabled). The row, column, and datapath are shifted to calculate the associated ECC address for an ECC command to correspond to each data command.

Below is a table illustratively summarizing the mapping from a received data storage address to inline ECC storage address for certain sample signals:

| Data Address | | | | | Inline ECC Address | | | | |
|---|---|---|---|---|---|---|---|---|---|
| Chip Select | Row | Bank | Column | Data Path[1] | Chip Select | Row | Bank[2] | Column | Data Path[1] |
| 0 | 16'h0000 | 3'b111 | 10'h000 | 1'b0 | 0 | 16'hE000 | 3'b001 | 10'h000 | 0 |
| 0 | 16'h0001 | 3'b111 | 10'h004 | 1'b0 | 0 | 16'hE000 | 3'b010 | 10'h001 | 1 |
| 0 | 16'h0008 | 3'b010 | 10'h1A4 | 1'b0 | 0 | 16'hE001 | 3'b011 | 10'h034 | 1 |
| 0 | 16'h1A85 | 3'b101 | 10'h158 | 1'b0 | 0 | 16'hE350 | 3'b110 | 10'h2AB | 0 |
| 0 | 16'h2004 | 3'b110 | 10'h110 | 1'b0 | 0 | 16'hE400 | 3'b111 | 10'h222 | 0 |
| 0 | 16'h8000 | 3'b000 | 10'h000 | 1'b0 | 0 | 16'hF000 | 3'b001 | 10'h000 | 0 |
| 0 | 16'hDFFF | 3'b100 | 10'h3FC | 1'b0 | 0 | 16'hFBFF | 3'b101 | 10'h3FF | 1 |
| 1 | 16'h1248 | 3'b011 | 10'h0FC | 1'b0 | 1 | 16'hE249 | 3'b100 | 10'h07F | 1 |
| 1 | 16'hCA0B | 3'b111 | 10'h3FC | 1'b0 | 1 | 16'hF941 | 3'b000 | 10'h1FC | 1 |

1. Example data path = 2 bytes.
2. Bank offset set to +1

Example 2: Inline ECC 3DS Partitioned Address Mapping with CID

In this example, the system user data address width is 34 bits, and is split into the fields/values shown below, with the following sample conditions:

The MAX numbers of ranks configured is 2, requiring 1 CS bit.
The MAX number of CIDs configured is 2, requiring 2 CID bits.
The system is interfacing to both ranks.
Configured address order is: CS, CID, ROW, BANK
The remaining address field MAX and actual bits per field are defined in the following table.

| Address Field | MAX | ACTUAL |
|---|---|---|
| Data path | 3 | 3 |
| Column | 10 | 10 |
| Row | 15 | 15 |
| CID | 2 | 2 |
| Bank | 3 | 3 |
| Chip Select | 1 | 1 |

FIG. 8 illustrates an example of an incoming user address with respect to Example 2. The lowest user addresses are mapped to CS0. The next highest contiguous user addresses are mapped to CS1. Inline ECC storage is configured to store ECC bytes of data words in ⅛th of the address space of both CS0 and CS1. CS0 and CS1 are split across 4 CID's each, and the MSB's for each CS are formed by the 2 CID's and the MSB of the row address. The ECC bytes, which take up ⅛th of the CS's total memory, are stored in the upper half of CID3. CS0 is organized to start at user address 00_0000_0000_. . . and extend up to location 01_1011_1111_. . . since the MSB of the CS address bits will only go up to "110" instead of "111" like non-inline ECC memories. CS1 will therefore begin at location 01_1100_0000_. . . , to avoid a hole in the user address space.

11_1111_1111_1111_1111_1111_1111_1111_1111
Out of range
11_1000_0000_0000_0000_0000_0000_0000_0000

11_0111_1111_1111_1111_1111_1111_1111_1111
CS1, CID3
11_0100_0000_0000_0000_0000_0000_0000_0000

11_0011_1111_1111_1111_1111_1111_1111_1111
CS1, CID2
10_1100_0000_0000_0000_0000_0000_0000_0000

10_1011_1111_1111_1111_1111_1111_1111_1111
CS1, CID1
10_0100_0000_0000_0000_0000_0000_0000_0000

10_0011_1111_1111_1111_1111_1111_1111_1111
CS1, CID0
01_1100_0000_0000_0000_0000_0000_0000_0000

01_1011_1111_1111_1111_1111_1111_1111_1111
CS0, CID3
01_1000_0000_0000_0000_0000_0000_0000_0000

01_0111_1111_1111_1111_1111_1111_1111_1111
CS0, CID2
01_0000_0000_0000_0000_0000_0000_0000_0000

00_1111_1111_1111_1111_1111_1111_1111_1111
CS0, CID1
00_1100_0000_0000_0000_0000_0000_0000_0000

00_0111_1111_1111_1111_1111_1111_1111_1111
CS0, CID0
00_0000_0000_0000_0000_0000_0000_0000_0000

User address 01_1100_0000_. . . forms CS1's location 0. A translation must occur in the row address, CIDs, and chip select, since the row address is not 00_000_0000_0000_0000 and the CS is not 1. The table illustrates samples of user addresses and how they are mapped to memory addresses (CS, CID, ROW, BANK, COL, Data Path) for this example.

|       | 33 | 33 32 | 31 30              | 16 15 | 13 12       | 3 2       | 0 |
|       | CS | CID   | ROW                | BANK  | COLUMN      | Data Path |   |
|-------|----|-------|--------------------|-------|-------------|-----------|---|
| #2.1  |    |       |                    |       |             |           |   |
| User  | 0  | 00    | 000_0000_0000_0000 | 000   | 0_0000_0000 | 000       |   |
| DRAM  | 0  | 00    | 000_0000_0000_0000 | 000   | 0_0000_0000 | 000       |   |
| ECC   | 0  | 11    | 100_0000_0000_0000 | 000   | 0_0000_0000 | 000       |   |
| #2.2  |    |       |                    |       |             |           |   |
| User  | 0  | 01    | 010_0000_0000_0000 | 000   | 0_0000_0000 | 000       |   |
| DRAM  | 0  | 01    | 010_0000_0000_0000 | 000   | 0_0000_0000 | 000       |   |
| ECC   | 0  | 11    | 101_0100_0000_0000 | 000   | 0_0000_0000 | 000       |   |
| #2.3  |    |       |                    |       |             |           |   |
| User  | 0  | 11    | 011_1111_1111_1111 | 111   | 1_1111_1111 | 111       |   |
| DRAM  | 0  | 11    | 011_1111_1111_1111 | 111   | 1_1111_1111 | 111       |   |
| ECC   | 0  | 11    | 111_0111_1111_1111 | 111   | 1_1111_1111 | 111       |   |
| #2.4  |    |       |                    |       |             |           |   |
| User  | 0  | 11    | 100_0000_0000_0000 | 000   | 0_0000_0000 | 000       |   |
| DRAM  | 1  | 00    | 000_0000_0000_0000 | 000   | 0_0000_0000 | 000       |   |
| ECC   | 1  | 11    | 100_0000_0000_0000 | 000   | 0_0000_0000 | 000       |   |
| #2.5  |    |       |                    |       |             |           |   |
| User  | 1  | 00    | 000_0000_0000_0000 | 000   | 0_0000_0000 | 000       |   |
| DRAM  | 1  | 00    | 100_0000_0000_0000 | 000   | 0_0000_0000 | 000       |   |
| ECC   | 1  | 11    | 100_1000_0000_0000 | 000   | 0_0000_0000 | 000       |   |
| #2.6  |    |       |                    |       |             |           |   |
| User  | 1  | 10    | 100_1111_1111_1111 | 111   | 1_1111_1111 | 111       |   |
| DRAM  | 1  | 11    | 000_1111_1111_1111 | 111   | 1_1111_1111 | 111       |   |
| ECC   | 1  | 11    | 111_0001_1111_1111 | 111   | 1_1111_1111 | 111       |   |
| #2.7  |    |       |                    |       |             |           |   |
| User  | 1  | 11    | 000_0000_0000_0000 | 000   | 0_0000_0000 | 000       |   |
| DRAM  |    |       | OUT OF RANGE ADDRESS |     |             |           |   |
| ECC   |    |       |                    |       |             |           |   |

For 3DS applications, The CID selects the particular sub-device (such as DRAM) within a stack selected by the chip select (CS). For the purposes of Inline ECC address decode, the CID is treated like the upper most Row address bits. Therefore, the ECC data is always stored in the highest CID, and decode depends on the width of the CID—1, 2, or 3 bits. The CID bits are thus combined with the upper Row address bits as needed, to serve as the upper 1-3 bits of the address within a chip select. The same address translations are applicable as with the Row address for the non-3DS case. Since the CID may be of 1, 2, or 3 bits for 2, 4, or 8 high 3D stacks, the upper 3-bits may defined as any of the following:

ROW[MSB:MSB-2]
CID[0], ROW[MSB:MSB-1]
CID[1:0], ROW[MSB]
CID[2:0]

Below is a table illustratively summarizing the mapping from a received 3DS data storage address to inline ECC storage address for certain sample signals:

| Data Address | | | | | | Inline ECC Address | | | | |
|---|---|---|---|---|---|---|---|---|---|---|
| Chip Select | CID | Row | Bank | Column | Data Path[1] | Chip Select | CID | Row | Bank[2] | Column | Data Path[1] |
| 0 | 2'h0 | 16'h0000 | 3'b111 | 10'h000 | 1'b0 | 0 | 2'h3 | 16'h8000 | 3'b001 | 10'h000 | 0 |
| 1 | 2'h2 | 16'hCA0B | 3'b111 | 10'h3FC | 1'b0 | 1 | 2'h3 | 16'hD941 | 3'b000 | 10'h1FC | 1 |

1. Example data path = 2 bytes.
2. Bank offset set to +1
3. CID = 2 bits

Row Translation:

Row translation in connection with inline ECC storage is carried out for both the data component row address and the ECC component row address pertaining to a data word. For data addresses, CS's above CS0 will generally start at a user row address offset from an all zero row address. In the initial example, CS1 starts at user address location 0111_0000_0000_0000_0000_0000_0000, and with a CS_WIDTH of 1, its user row address starts with 111_0000_0000_0000 instead of 000_0000_0000_0000 as shown in Example #1.4. Hence, the row translation logic employed serves to map the incoming user data address value to a different row address value in the memory device. For the corresponding inline ECC address, the 3 row address MSB's are preferably set to 3'b111, and the remaining row address bits are shifted to the right by 3 bit locations. The initial row address is thereby effectively divided by 8. For 3DS applications, the translation applies to the CID's and upper row address bits as necessary. The ECC row address is computed based on the translated data row address, and does not require further partitioned memory address translation.

The row address translation for the data component of a data word is isolated to the three most significant row bits. All other bits of the row field of the user address may be passed along to the memory device without translation. Suitable logic for padding internal controller addresses with 1 value is executed as needed to compensate for maximum address widths that may be used by the system internally.

As noted, the address translation between received data address and inline data and ECC access addresses disclosed herein is distinct from the address shifting conventionally employed (such as typically implemented in the user interface ports 3) for converting a packed byte address received from the user into a shifted byte address that is used internally by the memory controller system. The address shift logic preferably uses suitable configuration options and programmable registers to effect the address shift required. An address typically contains chip select, row address, bank address, column address, and data path (or memory byte) information combined into one address signal. An address shift module takes this information and reorganizes it into a shifted address formed by fixed fields with the given information suitably partitioned. The shifted address is then expanded so that all of the information is available in fixed locations based on the maximum supported width of each field. This resulting address is sent to the various modules of the given system where the required fields are easily indexed.

Since the maximum field widths are typically not all in use during operation, the unused bit locations are packed with 1's so that operations executed on the address will automatically carry to the next field. In the address translation carried out for inline ECC storage, the address mapping for ECC memory access is modified compared to the address for the associated data memory access. In order to shift row addresses to column addresses, and the like, re-mapping is preferably carried out on the unshifted address before adding the masking, etc.

The shifted ECC access address is preferably modified relative to the data address as follows. ECC column and datapath addresses are computed by shifting the data address (divide by 8) and shifting the lower row address bits to the top of the column. ECC split page (row) addresses are computed by shifting the data page address (divide by 8) and setting the upper row address bits to the appropriate ECC storage address values. For ECC reads, the address is aligned to a burst boundary, and the ECC length adjusted accordingly so that the ECC read spans the full length of the corresponding data command. ECC reads are preferably executed as full burst commands and cannot be optimized, so the command is simplified. However, the corresponding length is properly computed to include the correct number of bursts necessary. For ECC writes, the address is accurately computed for the corresponding byte associated with the data command. This may be done already for existing write transactions where data masking is available, and the ECC write properly updates the ECC to the byte address.

Command Translation

Read and write commands received at the user interface ports 3 may be from 1-byte in length to a certain other maximum command length supported by the particularly intended application. Commands are sub-divided in the command split unit 100 based on factors such as page boundary crossings, wrap commands, read-modify-write commands, etc. Since commands are normally split on page boundaries (for example, every 1K bytes), inline ECC storage is preferably sized to allow ECC bits to be fetched for up to a page of associated data bits in order to maintain this boundary and avoid introducing extraneous boundary conditions in connection with inline ECC storage conversion.

The commands involving read and write received through the user interface ports 3 are translated into a combination of read, write, and read-modify-write operations for both the data and ECC components of the error-protected data words to be operated on. The following tables summarize the commands and associated translations for various examples of user commands (shown by way of example, without limitation thereto).

Read Commands:

Received user read commands are translated to both a data read and an associated ECC read for the data word(s) in question. For a read operation, the ECC component of a data word is preferably read first and the resulting ECC check bytes stored, then the data component reads are executed. The ECC read stores the ECC check bytes for up to a page of data bytes—or up to the maximum command length supported in the command queue unit 110.

TABLE

Read Command Translation

| Received Command | Command Sequence | Notes |
|---|---|---|
| Reads | | |
| Read - 1 byte to 8 memory bursts not crossing an ECC data group boundary | RD-ECC, RD-DATA | A single ECC read gets enough data for up to 8× aligned read data. |
| Read crossing an ECC data group boundary within a single page | RD-ECC, RD-DATA | A read up to a page will generate an ECC read of all of the necessary ECC components for the entire read command. |
| Read crossing a page boundary | RD-ECC0, RD-DATA0, RD-ECC1, RD-DATA1, etc. | A read that crosses a page boundary is normally split. The corresponding ECC reads are accordingly split on the boundary, and the ECC buffer holds ECC for a single page of memory. |
| Wrap read | RD-ECC, RD-DATA | A wrap read must remain within a page. ECC for the entire wrap command is read first followed by the wrapped read data command. |

Write Commands with Masking:

With inline ECC storage employed in the particular example illustrated, write commands of less than 8 bytes of data aligned to an 8 byte boundary would require a read-modify-write to ensure the minimum data necessary to update the associated data byte. In order to verify that the read data being used to calculate the new ECC is correct, the associated ECC byte(s) must also be read and ECC verified. Single-bit errors would need to be corrected, and multi-bit errors would require that the new ECC be corrupted to maintain the error recognition.

For commands that require an ECC read, the subsequent ECC write may be executed as a masked write or, optionally, as an unmasked ECC write by combining the new ECC byte with the data read for the read data check. For consistency with the unmasked case, the data that is read is maintained for the write regardless of whether masking is used or not. Writes that exceed 8 bytes aligned to an 8 byte boundary do not require the data and ECC reads since the entire location will be overwritten. For long write sequences, the data words are accumulated in a write buffer and written at the end of the write sequence. The ECC buffer aligns to an ECC data group boundary—the amount of data associated with a single burst of ECC bits—therefore all write commands are preferably split on ECC data group boundaries.

Write Commands with No Masking:

Write commands not spanning an entire burst of write data (for example, 8×BL×Data Path Width aligned) require an ECC read-modify-write in order to obtain sufficient data to update the ECC associated with data byte(s) within the burst. Write commands of less than a burst require a data read-modify-write in order to obtain sufficient data to merge the write data for the write. For write commands of less than 8 bytes aligned to an 8 byte boundary, this read data is also needed to obtain the minimum data to update the ECC-associated data byte. In order to verify that the read data used for calculating the new ECC is not corrupt, the ECC byte(s) to be overwritten must be verified. Single-bit errors require correction, and multi-bit errors require the new ECC to be corrupted to maintain the error recognition. Writes that span an entire ECC burst do not require the data and ECC reads since the entire location will be overwritten. The ECC components of the data words to be written are accumulated in a buffer and written at the end of the write sequence.

Command Generation:

ECC read and write command entries are generated for entry as parts of command sequences within the command queue unit 110 in cooperation with the generation of existing read and write data command entries. The following features are preferably realized in connection with this process:

Suitable ECC logic conventionally associated with out-of-band ECC is enabled for inline ECC storage, and the same data command generation rules may be applied for inline ECC storage. For example, misaligned and/or masked writes generate read-modify-write data commands.

ECC storage start address and length are computed based on the data address and length.

ECC command sequences are atomic operations with a fixed order of execution. ECC command sequences that cross page boundaries are split at the page boundary, and each sequence within a page is atomic; however, the sequences are not atomic to one another where the page boundary is crossed.

TABLE

Command Split with ECC Command Generation Summary

| Command in Split Unit: | Rules: |
|---|---|
| Read | Necessarily preceded by an ECC read [ECC read, data read] is a fixed order, atomic operation |
| Write resulting in a data read-modify-write for ECC calculation (misaligned and/or masked) or no write mask requirement | Write masking supported: Generates an ECC read and ECC write [ECC read, data read, data write, ECC write] is a fixed order, atomic operation ECC writes may be executed as masked or unmasked writes Write masking unsupported: No change - no write mask option for ECC write. |
| Write resulting in a data RMW-WR-RMW or RMW-WR or WR-RMW. | Each command generated by command split unit handled individually for ECC generation. Optimal to execute a single ECC read and single ECC write. |
| Write - single burst/ Masked write | Write masking supported: A masked data write will necessarily align with an 8-byte boundary, and is otherwise converted to a RMW in order to calculate ECC Generates either a masked ECC write or an ECC RMW with masked write [masked data write, masked ECC write] is a fixed order, atomic operation [read ECC, masked data write, masked ECC write] is a fixed order, atomic operation |
| Write burst (no masking required); not a complete ECC data group. | Write masking supported: Generates a masked ECC write [data write, masked ECC write] is a fixed order, atomic operation Write masking unsupported: Generates an ECC read and ECC write [read ECC, data write, ECC write] is a fixed order, atomic operation |

TABLE-continued

Command Split with ECC Command Generation Summary

| Command in Split Unit: | Rules: |
|---|---|
| Write burst (no masking required); a complete ECC data group. | Generates an ECC write [data write, ECC write] is a fixed order, atomic operation |

ECC Buffer

ECC check bits for reads and writes are intermediately stored in suitable error storage unit. In the illustrated example, this is preferably implemented in the form of an ECC buffer. ECC commands access the ECC buffer for both ECC data storage and ECC data supply. Generally, various types of commands access the ECC buffer. They include:

Data writes which generate ECC bytes in the ECC generation logic. This ECC is stored at corresponding index addresses in the ECC buffer.

Data reads which source ECC bytes from the ECC buffer, and append them to the read data prior to evaluation by the ECC checking logic.

ECC writes which send ECC bytes accumulated during a data write to inline ECC storage regions of the memory device.

ECC reads which store ECC bytes read from inline ECC storage regions of the memory device in the ECC buffer.

In the illustrated embodiment, the ECC buffer is only partially utilized for most memory transactions. The ECC is preferably indexed in the ECC buffer based on the transaction address, so ECC bytes for different transactions tend to occupy different locations within the ECC buffer.

ECC buffer storage is preferably implemented as a general register storage array with a depth defined by the maximum supported column address width divided by 8 and a width defined by the DFI data width divided by 8, so as to be accessible in user data transfer widths for ECC read and write commands. For example, in order to maintain existing command boundaries, the ECC buffer is suitably sized to store the ECC associated with a page of data. (In one example: ECC buffer size=ECC to data ratio×2^maximum column address width×data byte width=$\frac{1}{8} \times 2^{10} \times 2$ bytes=256 bytes.)

Utilizing an ECC buffer sufficient to store the ECC bits for a complete page of data minimizes design complexity since new boundary conditions are not imposed in implementing inline ECC storage conversion, and improves performance by allowing memory transactions of maximum size to be executed without interruption from ECC operations. For memories with larger page sizes and wider data paths, the ECC buffer may be accordingly increased in size, but the resulting size and may be prohibitively large for some applications. In certain embodiments, a page size programming may be employed for optimal definition of page size to suit the ECC buffer size for certain operations or parts of the overall system, while other operations/parts of the system may continue using the actual/default page size, so as to prevent overly pessimistic timing, and the like On an ECC read, the ECC buffer is loaded with one or more bursts of ECC read bits. The inline ECC storage start address may then be computed based on the read address and rounded to the nearest ECC data burst boundary. ECC bits are stored in the ECC buffer, preferably indexed off of the complete page address regardless of the size of the memory transaction. For ECC, the entire burst is preferably stored in the ECC buffer.

Figure 9:
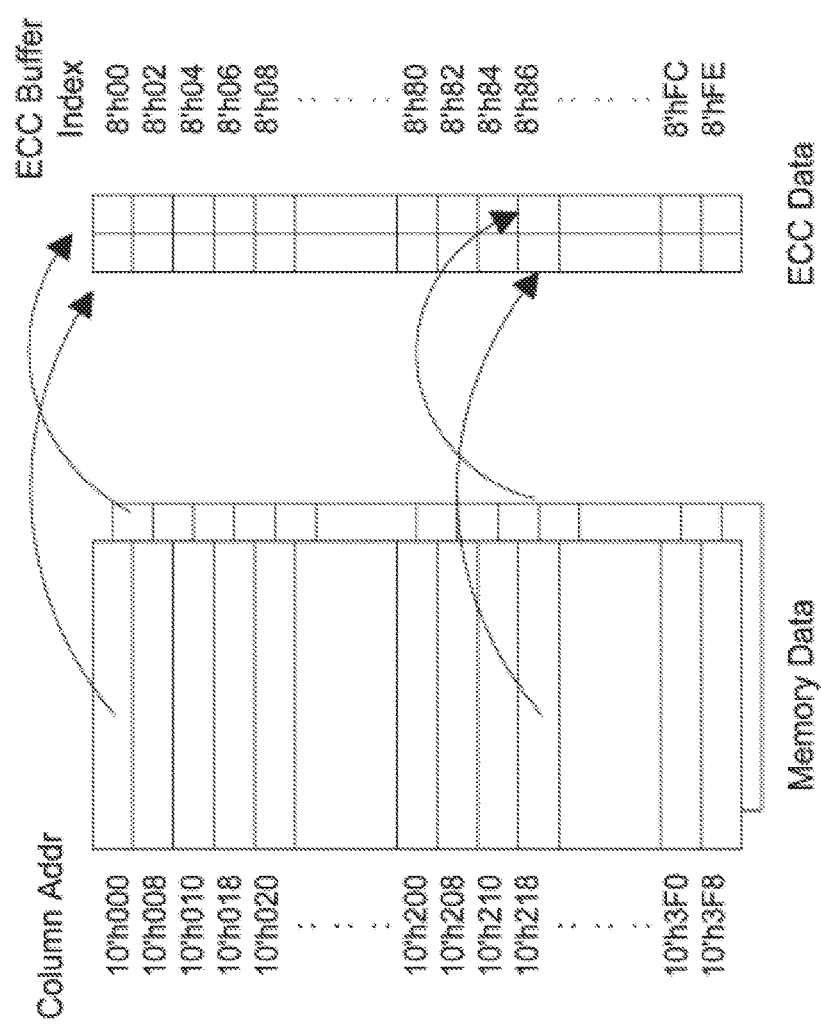
FIG. 9 is a schematic diagram illustrating a memory address of a data word of a memory transaction being indexed to an intermediate storage unit for error checking components of the data word.

FIG. 9 schematically illustrates an example of ECC buffer indexing. As shown, for data bytes stored in a certain page of memory at column address CA [9:0]=10'h218, for burst length=8, data path=2-bytes, the data would begin loading at CA divided by 4 (divide by 8 for 8:1 ratio, multiply by 2 for data path of 2) and mask the lowest 4 bits for burst alignment—or CA [9:4]=8'h80. For a subsequent data read, the ECC buffer is indexed on an ECC data burst boundary at location 8'h86.

Read/Write Operations:

For a write operation, an ECC read may be required prior to loading the buffer with the write ECC bits. In this case, the ECC bytes for the read data and write data are merged together in the ECC buffer. Otherwise, the ECC buffer may only contain the ECC bytes generated by the write operation. The start address may be computed based on the write address and rounded to the nearest ECC data burst boundary.

The read and write pointers for indexing into the ECC buffer are preferably provided by the address translation logic. The push and pop signals for timing the movement of ECC bits and updating pointers are suitably generated by the ECC unit 300 and memory access unit 200.

For a read operation, the ECC components are read from memory in advance of the associated data components of the data word being read, so the ECC associated with the read is pulled from the ECC buffer and combined with the read data prior to execution of the ECC check function. For a write operation, the ECC components are written to memory after the associated data components, so the ECC is generated with the write command and stored in the ECC buffer. When the ECC is written, the ECC components are pulled from the ECC buffer.

Figure 10A:
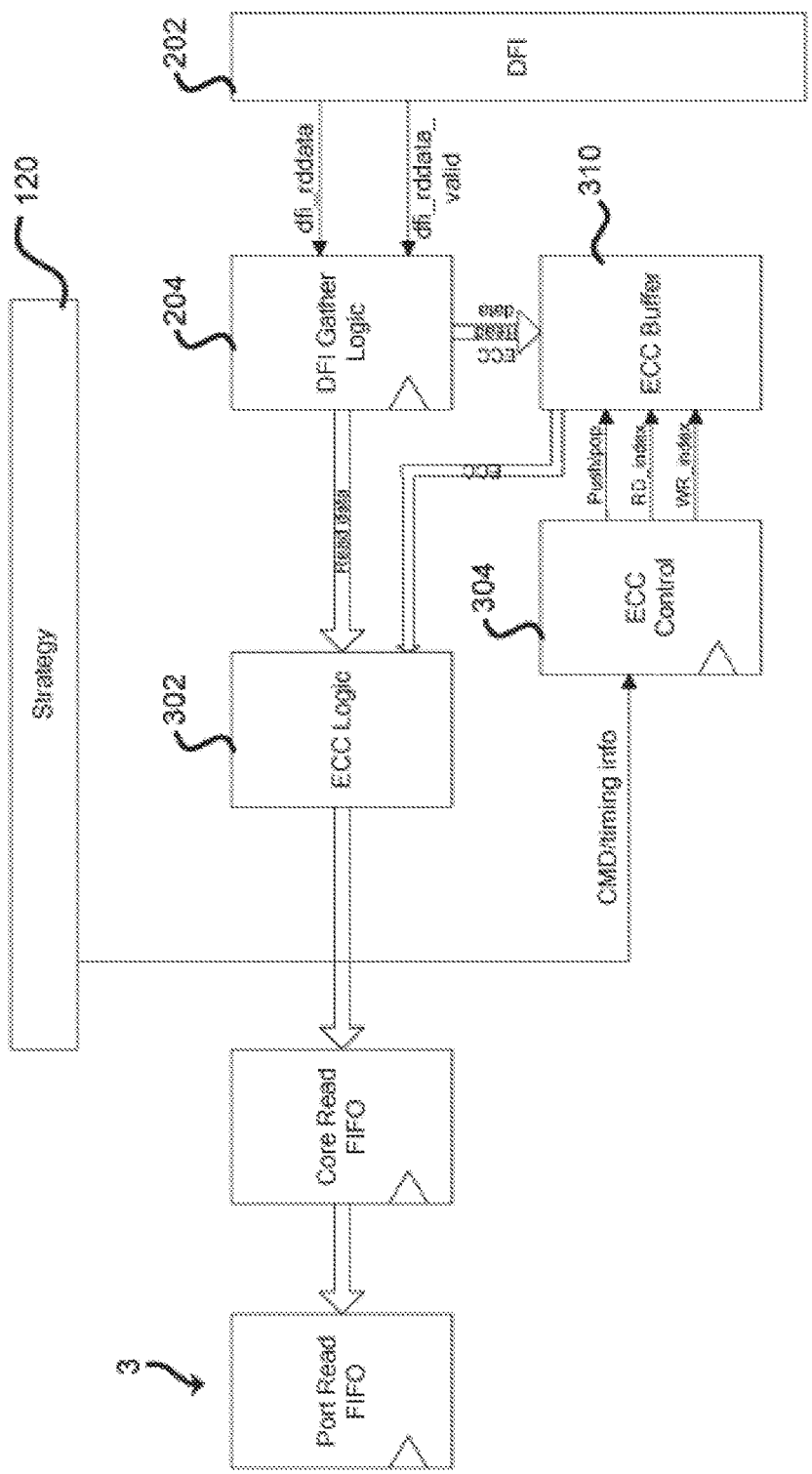
FIG. 10A is a schematic block diagram illustrating a data path in a portion of the system embodiment of FIG. 4, during an inline storage read operation.
Figure 10B:
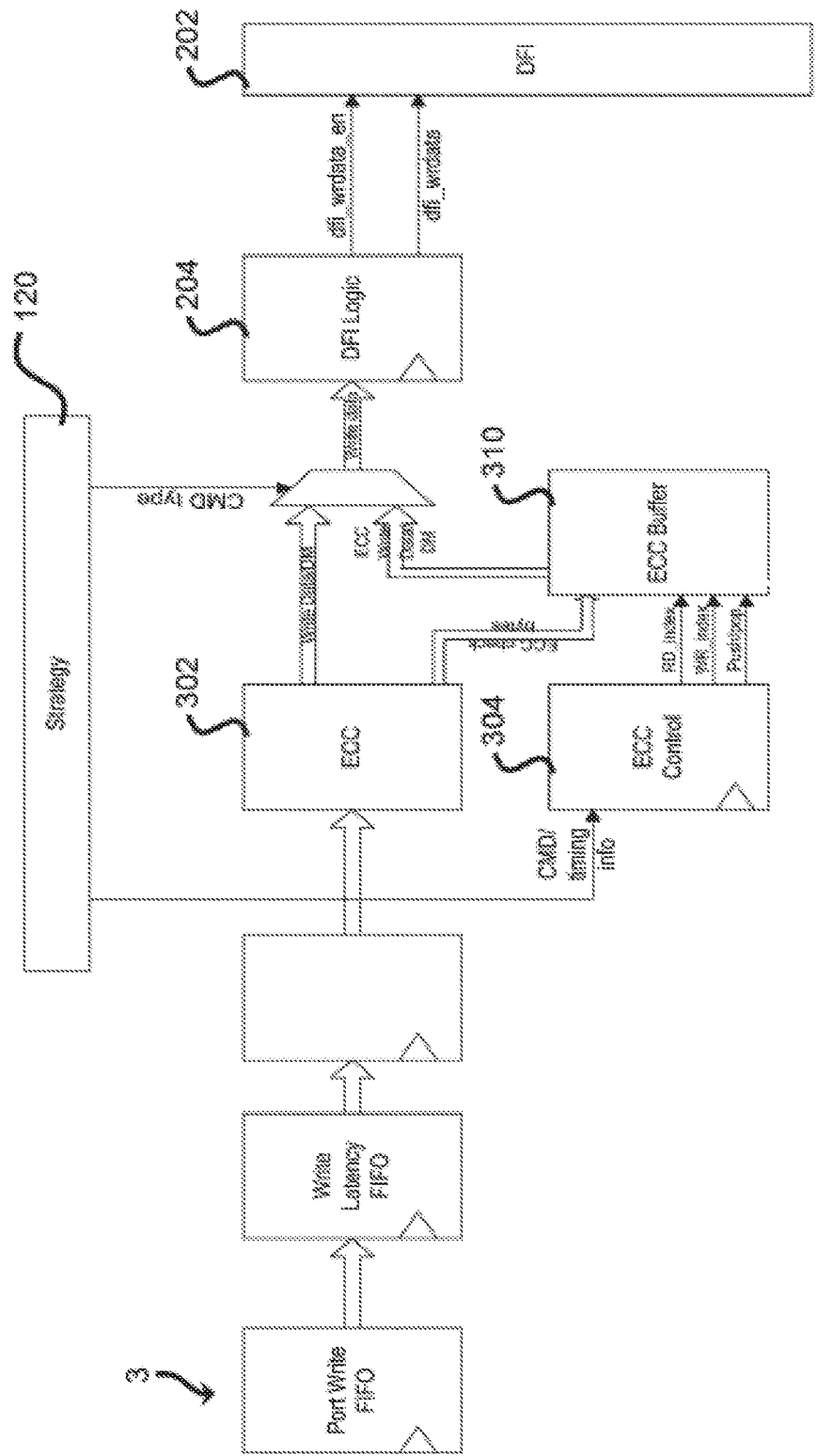
FIG. 10B is a schematic block diagram illustrating a data path in a portion of the system embodiment of FIG. 4, during an inline storage write operation.

FIGS. 10A and 10B schematically illustrate respective read and write data paths carried out with intermediate storage of ECC bits by the ECC buffer in accordance with one exemplary embodiment of the present invention. During a read operation, as illustrated in FIG. 8A, the strategy execution unit 120 executes to suitably manage differences between data and ECC read commands. For ECC commands, the strategy execution unit 120 transmits command and control signals to the ECC buffer 310 to either capture the ECC read bytes from the memory device or provide the ECC check bytes for incoming read data. For an ECC read from the memory device, the ECC bytes that are read are loaded into the ECC buffer upon a suitably implemented ECC control section 304 asserting a push signal. For data byte reads from the memory device, the ECC control section asserting a pop signal indicating to the ECC buffer 310 the timing for sending the ECC bytes along with the read data (from an interface gather logic section 204) to the given ECC check logic section 302. The read gather logic section 204 is suitably implemented with a DFI section 202 of any suitable type known in the art as part of the memory access interface unit 200. The read gather logic section 204 preferably captures both the bits/bytes for both data reads and ECC reads from the memory device.

The ECC control section 304 receives command and timing information from the strategy execution unit 120 and determines the start address for loading ECC during a ECC read operation and read-indexing into the ECC buffer 310 for proper alignment to the associated data read from the memory device. The ECC control section 304 generates a write index as needed to indicate where to load the ECC bytes on the ECC read, and a read index to indicate where to pop the ECC byte for the next clock of a data read. The ECC buffer 310 stores the ECC bytes for the current command.

During a write operation, as illustrated in FIG. 8B, the strategy execution unit 120 executes to suitably manage differences between data and ECC write commands. For ECC commands, the strategy execution unit 120 provides the ECC command information needed (to a multiplexing section 306) for ECC address translation and the command type for the ECC logic to properly direct the incoming command. The ECC logic executes and drives the push signal during the data write to load the generated ECC bytes into the ECC buffer and provide the pop signal to properly time the ECC write flow during the write operation. The ECC control section 304 receives command information from the strategy execution unit 120 and determines the start address for loading ECC bytes during the associated data write and write-indexing into the ECC buffer 310 for proper alignment to the associated data to written to the memory device. The write index indicates where to load the ECC bytes on the data write, and the read index indicates where to pop the ECC bytes for the next clock of a data write. The DFI section 202 sends out write data from both the normal data path and ECC write path from the ECC buffer 310.

Read-Modify-Write Operation:

A read-modify-write (RMW) transaction may employ the read and write paths illustrated in FIGS. 10A-10B. Preferably, the read gather logic 204 of the DFI section 202 executes to capture ECC read components. The captured ECC components are subsequently used to provide check data bits for a data read. This data remains in the ECC buffer 310 during a read-modify-write operation. The ECC address translation section 102 receives command information from the strategy execution unit 120 for the requisite sequence or ECC read, data read, data write, and ECC write operations of a RMW transaction. For each operation in the sequence, the address translation logic properly indexes into the ECC buffer 310. The strategy execution unit 120 provides command information for proper address translation and data steering. DFI and ECC accordingly direct the data/ECC as defined for read and write transactions and corresponding push/pop timing information.

Command Split

The inline ECC storage conversion provided by the illustrated embodiment requires each translated command sequence to include read and/or write ECC accesses as part of the sequence. An exception may be in a flush write or other such command that does not actually transfer any data.

The command split unit 100 preferably includes a state machine, suitably configured to establish the command sequences as described herein. In most cases, an inline ECC command sequence will either begin with an ECC read command or transition to an ECC write as the next state. In general, if the first command is an ECC read, the current non-inline ECC command generated in an IDLE state becomes the $2^{nd}$ command in the sequence. In the illustrated embodiment and application, the first command in a sequence is preferably issued in the IDLE state, obviating the need for a separate state in the state machine for the commands. Therefore a new set of states will be created as next states in the inline ECC sequence. Preferably, each command sequence defines a unique state.

TABLE

Examples of Inline ECC Command Split States

| State | Description |
|---|---|
| READ | Issue a read |
| WRITE | Issue a write following an ECC read for an ECC RMW sequence. |
| RMODW_READ | Issue the read for a RMODW sequence; single read, single write |
| OPT_RMODW_RDFIRST | Issue the first read for an optimized RMODW sequence |
| SPLIT_RMODW_FIRST_READ | Issue the first data read in a split RMODW sequence |
| SPLIT_OPT_RMODW_RDFIRST | Issue the first read in a RMODW sequence |
| SPLIT_FIRST_READ | Issue the first read in a split read sequence |
| WRAP_RMODW_FIRST_READ | Issue the first read in a RMODW wrap sequence |
| WRAP_FIRST_READ | Issue the first read in a wrap read sequence |
| ECC_READ | Issue an ECC read |
| ECC_WRITE | Issue an ECC write |

Command split factors applicable to data and ECC are different relative to the address alignment and length of write data command, since a single aligned transfer that may be executed without masking is smaller for data than for ECC, a byte of which is associated with 8 bytes of data. The following table summarizes in this regard.

TABLE

Write vs RMW based on Data Alignment, Data and ECC, Data Masking (DM) and No DM

| Data Alignment | Data - No DM | ECC - No DM | Data - DM | ECC - DM |
|---|---|---|---|---|
| Unaligned to 8 byte boundary | RMW | RMW | RMW | RMW |
| ECC data word aligned (8 bytes but not burst aligned) | RMW | RMW | Write | Write |
| Data aligned (BLxDP) | Write | RMW | Write | Write |
| ECC aligned (8xBLxDP) | Write | Write | Write | Write |

Figure 11A:
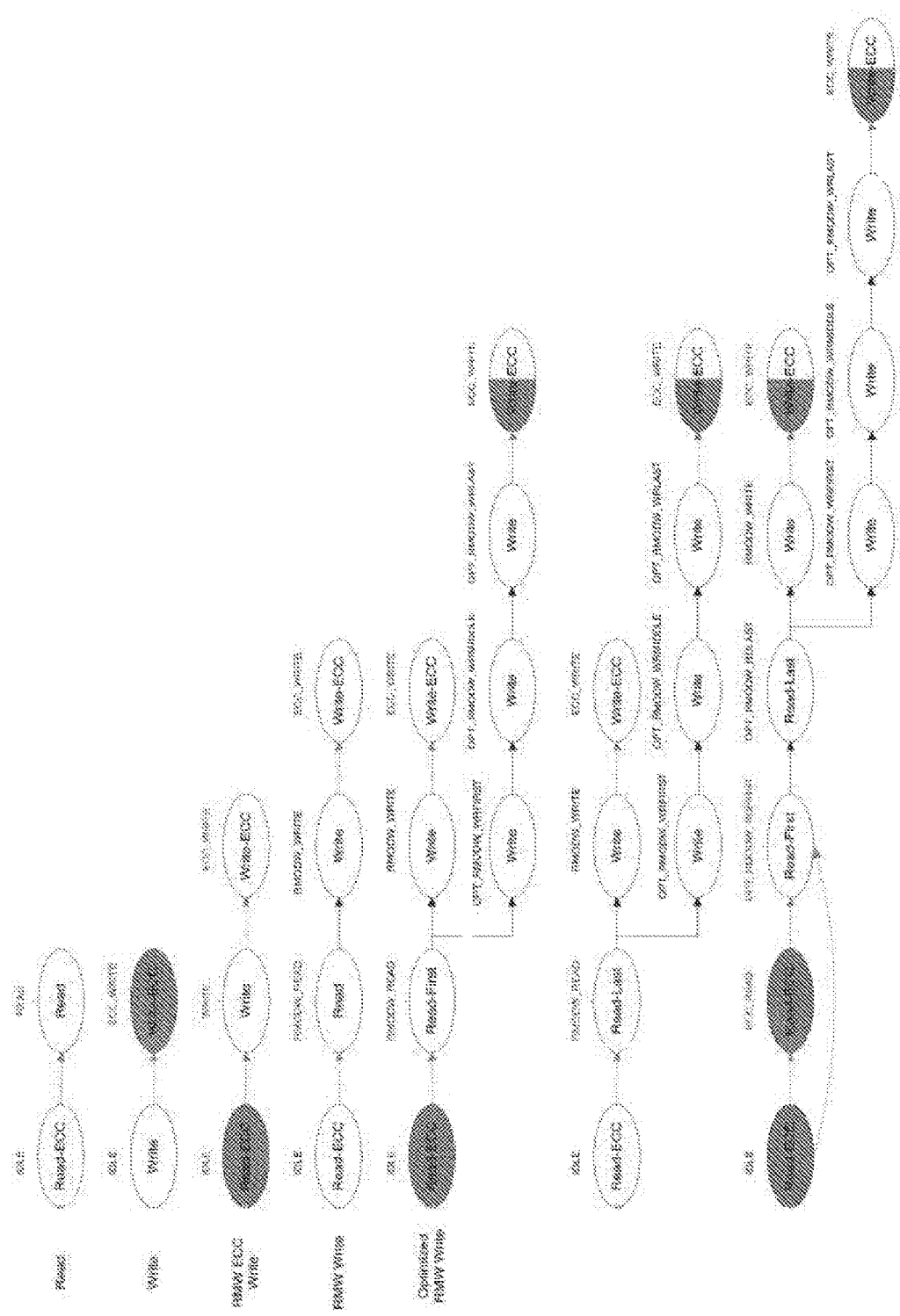
FIGS. 11A-11C are state diagrams illustrating a progression of certain command sequences generated during operation of the system embodiment of FIG. 4; and, FIG. 12 is a schematic block diagram illustrating an example of a command placement and selection during operation of a certain portion of the system embodiment of FIG. 4.
Figure 11B:
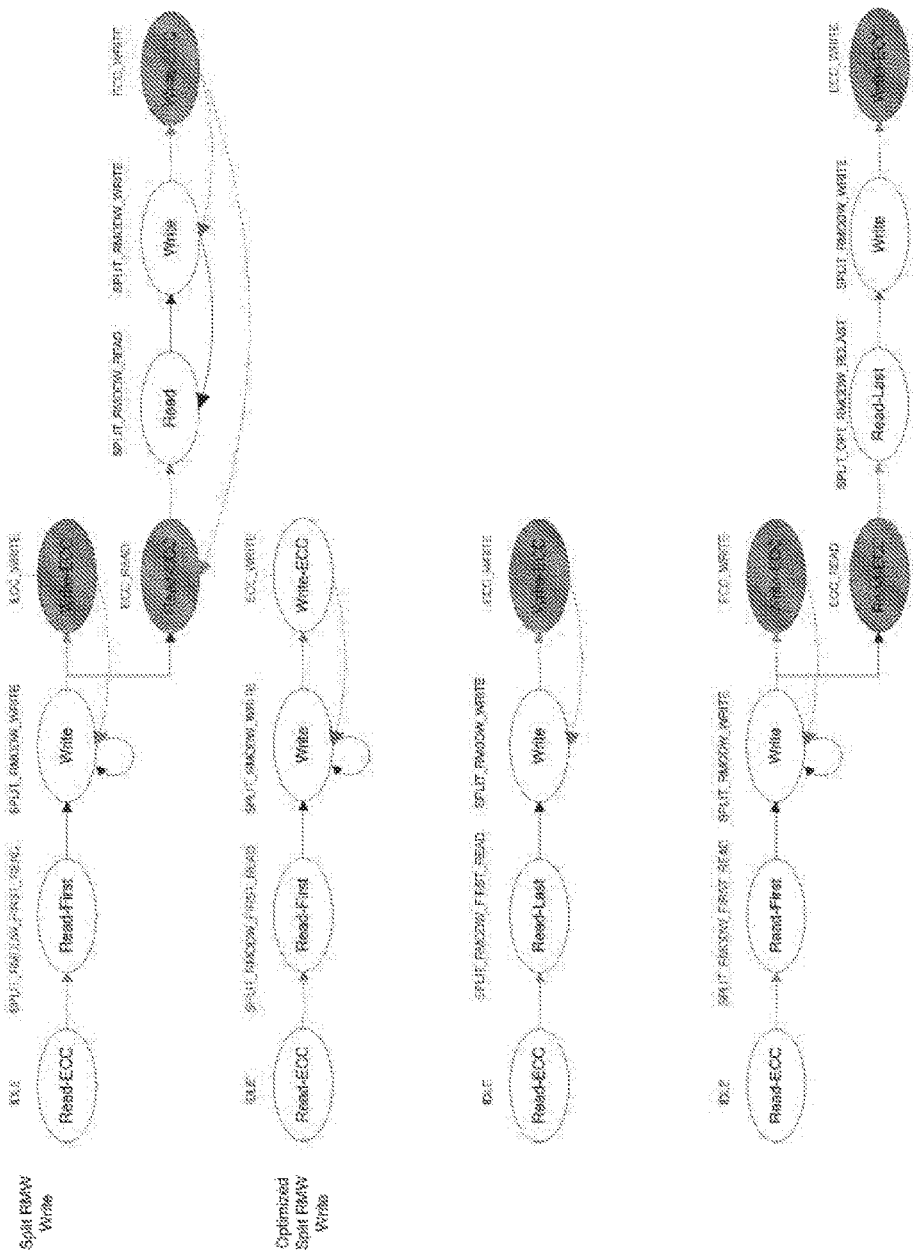
Figure 11C:
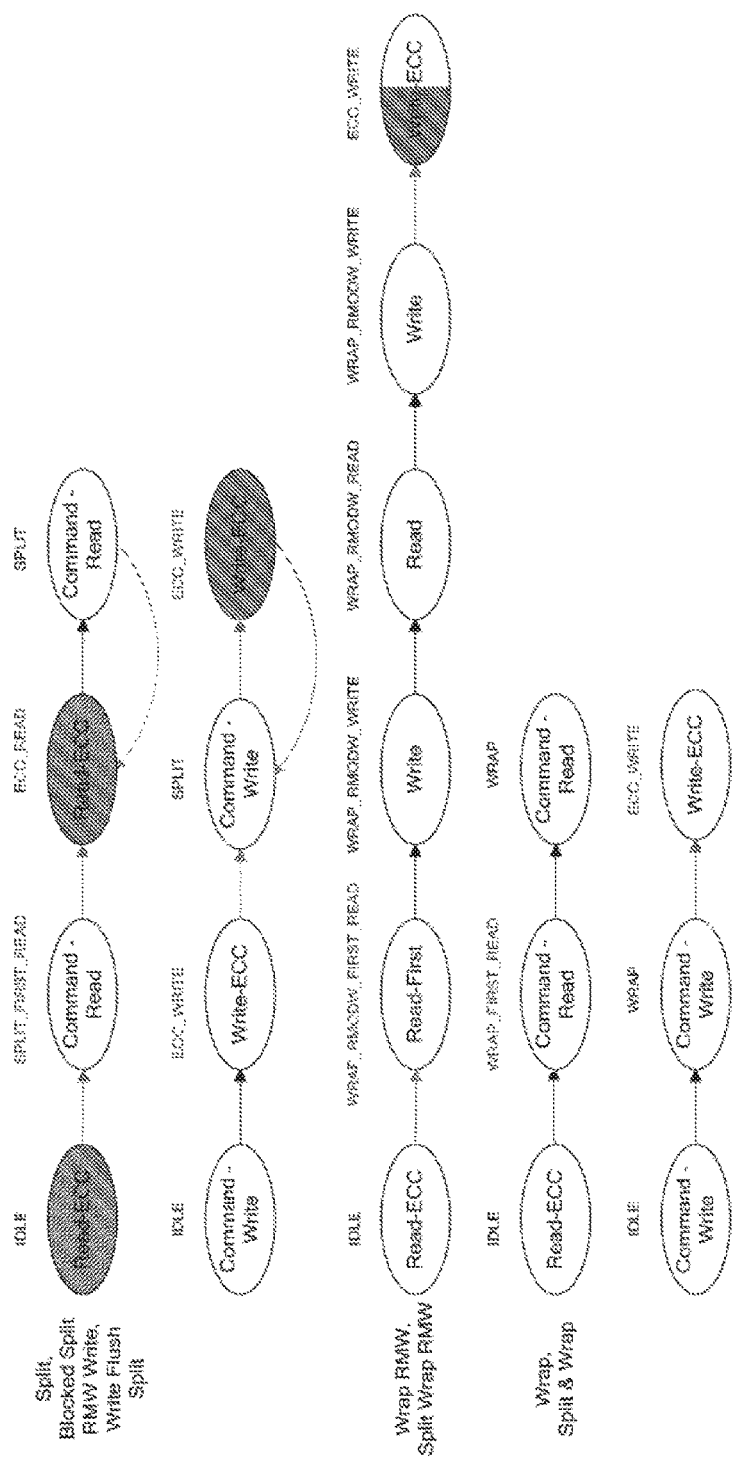

FIGS. 11A-11C schematically illustrate how certain sample commands may be processed in the command split unit 100, with inline ECC storage based on various command property decodes. Shaded states denote newly-generated commands and states in the sequences shown.

The following table summarizes changes to received command sequences to realize command sequences compatible with an inline ECC storage configuration.

TABLE 1

Changes to Command Flow for Inline ECC

| Command Sequence | Changes |
|---|---|
| Read - no page crossing, no wrap. | Single ECC read preceding the data read. |
| Write - aligned such that no RMW required for data, no page crossing, no wrap; ECC does not require RMW. | If write DM is enabled, if the write is ECC byte aligned (address and length), only an ECC write is required following the data write. If no write DM, if the write is ECC data group aligned (address and length), only an ECC write is required following the data write. |
| Write with RMW ECC Write - aligned such that | If the write is not aligned (address and length) as described in "Write" above, the ECC write is converted to an RMW write with the ECC |
| no RMW required for data, no page crossing, no wrap; ECC does require RMW. | read preceding the data write and followed by an ECC write. |
| RMW Write - no page boundary crossing | Single ECC read and write. For a non-optimized case, the ECC read spans the entire length of the transaction. The ECC write writes the ECC for the entire write sequence. |
| Optimized RMW Write - RMW required for first and/or last write but not in between, no page boundary crossing | One or two ECC reads and a single ECC write. For an optimized case, the ECC read only reads the ECC bits associated with the Read-First and Read-Last addresses; these data commands each form a burst command in length such that a single ECC burst command suffices for accumulating the ECC associated with each; reading both First and Last may take a single ECC read or two ECC reads to obtain the required ECC byte(s). The ECC write writes the ECC for the entire write sequence. |
| Split RMW Write - same as RMW write with page crossing | One ECC read and one ECC write per page. For a non-optimized case, the ECC read only reads the ECC data associated with the first and last read addresses. The ECC write writes the ECC for the entire write sequence. This is done for each page in the transaction. |
| Optimized Split RMW Write - same as optimized RMW write with page crossing | One ECC read and one ECC write per page. For an optimized case, the ECC read only reads the ECC associated with the first and last addresses as applicable. The ECC write writes the ECC for the entire write sequence. This is done for each page in the transaction. In the case where the first and last data must both be read, inline ECC requires the ECC and data read for last to wait until the page associated with the data is accessed since there is only a single ECC buffer. |
| Split Commands - read or write command crossing a page boundary, not an RMW | Single ECC command per page. Split commands necessarily classified as reads or writes. Reads are preceded by an ECC read per page, and writes are followed by an ECC write per page. Both the ECC reads and writes span the entire data of the command. |
| Wrap RMW Write - wrap command requiring RMW for data. | Single ECC read and single ECC write. Wraps do not cross a page boundary, so a single read and write are required. The ECC read and write span the entire command. |
| Wrap with ECC RMW Write - wrap command requiring does not require data RMW but does require RMW for ECC. | Single ECC read and single ECC write. Wraps do not cross a page boundary, so a single read and write are required. The ECC read and write span the entire command (not shown in the figures). |
| Wrap Commands - not an RMW | Single ECC command per page. Wrap commands classified as reads or writes. Reads are preceded by an ECC read per page, and writes are followed by an ECC write per page. Both the ECC reads and writes span the entire data of the command. |

Every command's address is output from the command split unit 100 by a suitable address signal. The address is output from the split unit state machine on a command by command basis.

ECC Length Computation:

In addition to ECC address computation, ECC commands entail computation of length. The ECC command length may generally be computed based on the command address, command type, disposition within a command sequence, and other suitable system parameters. The command type, read or write, determines how the ECC length is computed. ECC reads are aligned to burst boundaries and length determines the number of bursts required. ECC writes are byte aligned since an ECC write can be on a byte granularity when write data masking is supported. The start address and length are used to determine how the command aligns to 8-byte data boundaries for writes or burst boundaries for reads, which factor into the ECC command length required.

Each ECC command's length is generated and output preferably from the state machine suitably implemented in the command split unit 100, on a command by command basis. In certain applications, the length of ECC commands may be based, for example, on such factors as:

ECC maintaining 1:8 ratio to data length.

ECC necessarily being read in bursts such that a single ECC read provides the ECC for an entire ECC data group.

ECC reads being aligned in predetermined manner in relation to ECC data group boundaries.

ECC read length being computed to read the correct number of bursts accounting for address masking to align to an ECC burst boundary.

ECC write length being computed as required for write masking where ECC may be written on byte granularity.

ECC commands being specified by start address and length and converted to the necessary reads and writes in the same way as data commands.

ECC lengths are preferably computed for each ECC command generated by the command split unit 100, with the length computations being based on the associated command length. For each command sequence, an ECC version of the command length is computed accordingly, and an ECC version is generated for the signal indicating command length from the command split unit's state machine.

Command Queue

For Inline ECC, command sequences are necessarily executed in order, without other commands being interleaved within the sequence. Commands split on page boundaries are not atomic at the page boundary. The ECC bytes for a page of data are preferably stored contiguously in a common ECC buffer, and the buffered ECC may be compromised by another command sequence executing out of order.

The command queue unit 110 allows command ordering in three places—placement, selection, and swap. Command placement is how commands are placed coming from the command split unit 100 into the command queue unit 110 (CQ). Placement rules determine where in the CQ a command is placed. Commands are allowed to pass commands of lower priority or be reordered according to optimized command grouping, etc. when no conflicts prevent the reordering. In the illustrated embodiment, for example, a RMW command placement is restricted to the extent that an RMW cannot pass another RMW.

For Inline ECC, such command placement rules are applied only to the first command in a command sequence. The other command(s) in the sequence must be placed in the CQ entries in order immediately following the initial command in the sequence. In addition, command placement may only occur in front of the initial commands of a sequence since command interleaving is precluded, and all subsequent commands must block insertion. Since an RMW cannot pass an RMW already in the CQ, RMW's are placed behind current RMW commands.

Figure 12:
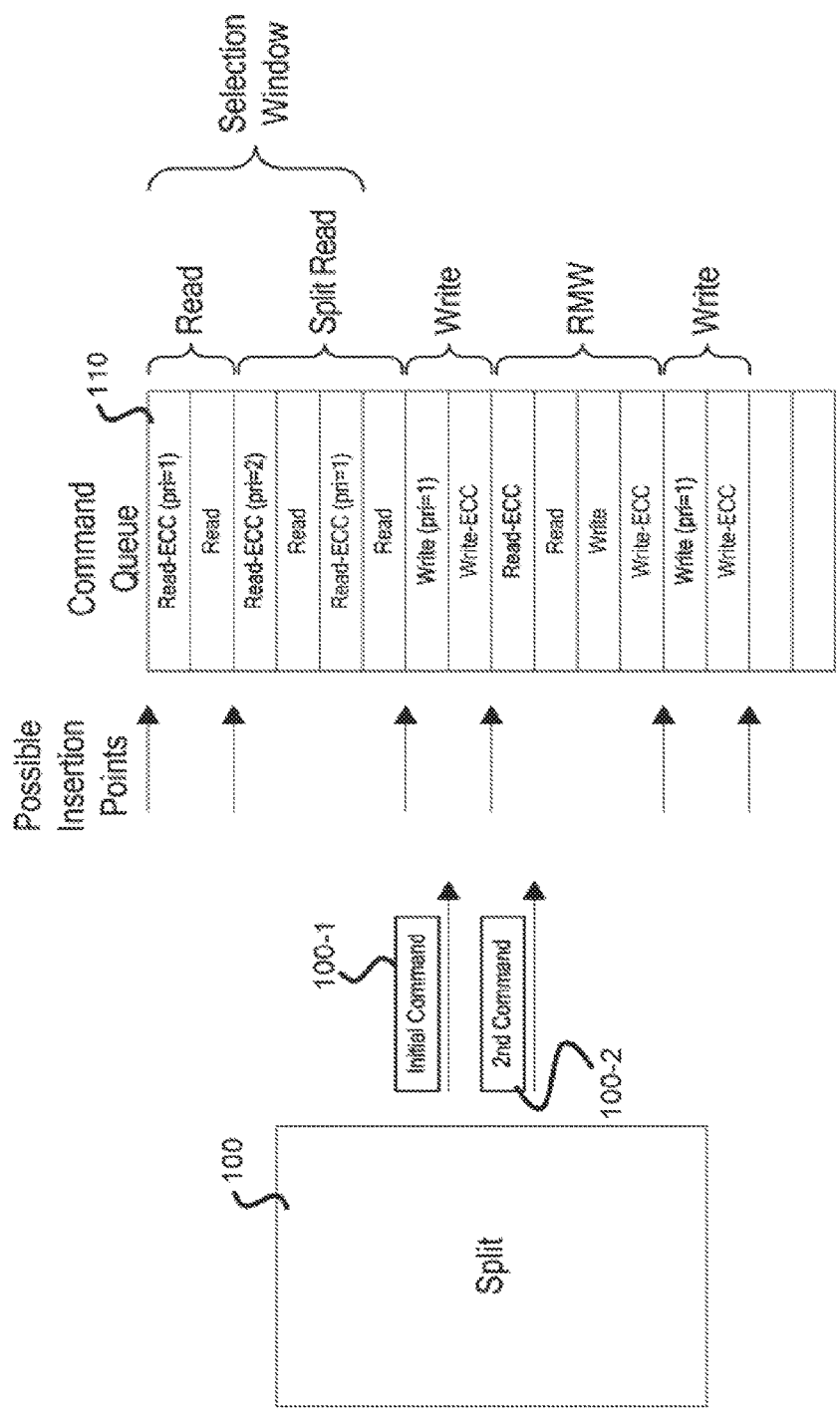

FIG. 12 schematically illustrates an example of such command placement and selection in the CQ for inline ECC storage, in accordance with one embodiment and application of the present invention. The illustrated CQ at the instant in time shown contains a plurality of command sequences, namely Read, Split Read, Write, RMW, and Write sequences queued up in order as shown. The commands translated by the command split unit 100 are provided as a new command sequence for by an initial command 100-1 and a second command 100-2. This new command sequence may be placed in front of the already queued command sequences' initial commands only, as indicated by the arrows pointing to the possible insertion points. Placement in between commands within the existing sequences is precluded. So the initial command 100-1 in the new command sequence may be placed, subject to the placement rules, at any of the possible insertion points denoted. The second command 100-2 of the new command sequence must be placed at the entry point immediately following the initial command 100-1.

Command selection defines a window of commands in the top entries in the CQ that are evaluated as possible candidates for the next command issued to the strategy execution unit 120 from the CQ. Command selection applies predefined rules to determine which command to choose.

For Inline ECC storage, the command selection process is thereby applicable only to selecting between initial commands of candidate sequences, with no extraneous consideration needed for subsequent commands in the sequence regarding their readiness for execution. Since the selection window is generally small (typical selection size=4), selection is often limited to consideration of one or two commands.

One or more portions of the system embodiments disclosed herein may include a computer processor based implementation, the system embodiments may include a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for controlling error-protected access to a memory device having address integrity protection for data words of memory transactions, comprising:

a communication port receiving commands for the memory transactions from a master control operation, each command having a port address predetermined for at least one data word corresponding to a memory transaction;

an interface logic portion coupled to said communication port, said interface logic portion adaptively converting the port address to a memory address, said interface logic portion including at least one adaptation stage carrying out a predefined adaptation response on an address propagated during a clock cycle of operation;

an address protection logic portion coupled to said interface logic portion, said address protection logic portion configuring said adaptation stage to maintain the predefined adaptation response over at least two clock cycles, said address protection logic portion detecting address error based on comparison of output addresses generated upon propagation of a common input address through said adaptation stage during each of the at least two clock cycles; and, a command control logic portion executing on a processor to actuate access to the memory device responsive to each command received with a corresponding memory address from said interface logic portion, said command control logic portion executing to adaptively split the command into at least data access and error checking access commands respectively having split addresses, the split addresses being mutually offset in value according to an inline storage configuration of the memory device.

2. The system as recited in claim 1, wherein said interface logic portion operates to propagate an address during at least two consecutive clock cycles of operation, said address protection logic portion includes an error validation component executing to selectively validate the address error detection based on said adaptation stage remaining constant in the predefined adaptation response over the at least two consecutive clock cycles.

3. The system as recited in claim 2, wherein the address error detection for a command is bypassed responsive to invalidation by said error validation component, said address protection logic portion selectively indicating a fault responsive to a validation rate tolerance threshold of predetermined value less than 100%.

4. The system as recited in claim 1, wherein said adaptation stage includes at least one section selected from the group consisting of:
an adaptation logic section executable for converting the input address of said adaptation stage;
a multiplexer section; and,
a set and hold section.

5. The system as recited in claim 4, wherein said address protection logic portion includes for each said adaptation stage at least one logic component executable to maintain the predefined adaptation response constant over the at least two clock cycles, said logic component being selected from the group consisting of:
an input address restore component;
an adaptation logic control component;
a multiplexer control component;
a set and hold control component.

6. The system as recited in claim 5, wherein said address protection logic portion further includes an error validation component executing to selectively validate the address error detection based on said adaptation stage remaining constant in the predefined adaptation response over the at least two clock cycles, said error validation component selectively validating the error detection based on:
said adaptation stage having a same input address applied thereto for each of the at least two clock cycles; and,
a selected one of said adaptation logic, multiplexer, and sample and hold sections remaining constant in operational configuration for each of the at least two clock cycles.

7. The system as recited in claim 1, wherein said interface logic portion includes a plurality of said adaptation stages intercoupled through intermediate registers for pipelined execution.

8. The system as recited in claim 7, further comprising a parity check logic portion coupled to at least one of said communication port and interface logic portion, said parity check logic portion operating on a port address for a command received by said communication port with at least one parity bit, said parity check logic portion executing to check the parity bit of the port address for responsive passage through said interface logic portion, said parity check logic portion including a parity adaptation section executing to convert said parity bit for at least one of said adaptation stages according to the predefined adaptation response.

9. The system as recited in claim 1, further comprising a parity check logic portion coupled to at least one of said communication port and interface logic portion, said parity check logic portion operating on a port address for a command received by said communication port with at least one parity bit, said parity check logic portion executing to check and responsively remove the parity bit from the port address for passage through said interface logic portion.

10. The system as recited in claim 7, wherein at least one of said adaptation stages executes to carry out the predefined adaptation responses selected from the group consisting of:
shifting the input address to align one or more of a Chip Select, Row, Bank, and Column address fields;
pad the input address to compensate for unused address fields;
transform the input address substantially for contiguous indexing in an address space for the memory device;
increment the input address for a memory transaction requiring multiple clock cycles for full execution;
remapping the input address according to a selectively programmable option; and,
masking unnecessary bits of the input address.

11. A system for controlling error-protected access to a memory device having address integrity protection for data words of memory transactions, comprising:
a communication port receiving commands for the memory transactions from a master control operation, each command having a port address predetermined for at least one data word corresponding to a memory transaction;
an interface logic portion coupled to said communication port, said interface logic portion adaptively converting the port address to a memory address, said interface logic portion including a plurality of adaptation stages intercoupled through intermediate registers for pipelined execution, each said adaptation stage carrying out a predefined adaptation response on an address propagated during a clock cycle of operation;
an address protection logic portion coupled to said interface logic portion, wherein:
said address protection logic portion configures each said adaptation stage to preserve the predefined adaptation response over at least two consecutive clock cycles;
said address protection logic portion detects address error for each of said adaptation stages based on comparison of output addresses generated upon propagation of a common input address through said adaptation stage during each of the at least two consecutive clock cycles; and,
said address protection logic portion includes an error validation component executing to selectively validate the address error detection of each said adaptation stage based on the predefined adaptation response remaining constant over the at least two consecutive clock cycles; and, a command control logic portion executing on a processor to control access to the memory device responsive to each command received with a corresponding memory address from said interface logic portion, said command control logic portion executing to adaptively split the command into at least data access and error checking access commands respectively having split addresses, the split addresses being mutually offset in value according to an inline storage configuration of the memory device.

12. The system as recited in claim 11, wherein the address error detection for a command is bypassed responsive to invalidation by said error validation component, said address protection logic portion selectively indicating a fault responsive to a validation rate tolerance threshold of predetermined value less than 100%.

13. The system as recited in claim 11, wherein:
each said adaptation stage includes at least one section selected from the group consisting of:
an adaptation logic section executable for converting the input address of said adaptation stage;
a multiplexer section;
a set and hold section; and,
an output address compare section; and,
said address protection logic portion stage includes for each said adaptation stage at least one logic component executable to maintain the predefined adaptation response constant over the at least two consecutive clock cycles, said logic component being selected from the group consisting of:
an input address restore component;
an adaptation logic control component;
a multiplexer control component; and,
a set and hold control component.

14. The system as recited in claim 13, wherein said error validation component said address protection logic portion selectively validates the error detection based on:
said adaptation stage having a same input address applied thereto for each of the at least two consecutive clock cycles; and,
a selected one of said adaptation logic, multiplexer, and sample and hold sections remaining constant in operational configuration for each of the at least two consecutive clock cycles.

15. A method for controlling error-protected access to a memory device with address integrity protection for data words of memory transactions substantially maintained through an entire address path defined between a communications port and the memory device, comprising:
receiving commands for memory transactions from a master control operation through the communication port, each command having a port address predetermined for at least one data word corresponding to a memory transaction;
propagating the port address through an interface logic portion to adaptively convert the port address to a memory address, said interface logic portion including at least one conversion stage to carry out a predefined conversion response on an address propagated during a clock cycle of operation;
configuring said conversion stage to maintain the predefined conversion response of said conversion stage constant for each of at least two clock cycles, and iteratively propagating a same input address through said conversion stage over the at least two clock cycles;
detecting address error based on comparison of output addresses generated by the iterative propagation of a same input address through said conversion stage over the at least two clock cycles to thereby provide address protection through a first part of the address path; and,
executing a command control logic portion on a processor to actuate access to the memory device responsive to each command received with a corresponding memory address from said first part of the address path, said command control logic portion being executed to adaptively split the command into at least data access and error checking access commands respectively having split addresses for passage through a second part of the address path, the split addresses being mutually offset in value according to an inline storage configuration of the memory device.

16. The method as recited in claim 15, further comprising:
executing an error validation component to selectively validate the address error detection based on said conversion stage remaining constant in the predefined conversion response over the at least two clock cycles;
bypassing the address error detection for a command responsive to invalidation by said error validation component;
monitoring a rate of a validation by the error validation component over a series of the commands; and,
selectively indicating a fault condition responsive to the rate of validation relative to a tolerance threshold of predetermined value less than 100%.

17. The method as recited in claim 15, wherein at least one logic component is executed for said conversion stage to maintain the predefined conversion response constant over the at least two clock cycles, said logic component being selected from the group consisting of:
a component for restoring the input address for consistent application to said conversion stage for each of the at least two clock cycles;
a component for controlling a conversion logic section of said conversion stage;
a component for controlling a multiplexer section of said conversion stage; and,
a component for controlling a set and hold section of said conversion stage.

18. The method as recited in claim 17, wherein an address is propagated through said conversion stage of said interface logic portion during at least two consecutive clock cycles of operation, the method further comprising executing an error validation component to selectively validate the address error detection based on said conversion stage remaining constant in the predefined conversion response over the at least two consecutive clock cycles;
wherein said error validation component selectively validates the error detection based on:
said conversion stage having a same input address applied thereto for each of the at least two consecutive clock cycles; and,
a selected one of said conversion logic, multiplexer, and sample and hold sections remaining constant in operational configuration for each of the at least two consecutive clock cycles.

19. The method as recited in claim 15, wherein:
a plurality of said conversion stages are executed in pipelined manner intercoupled through intermediate registers in said interface logic portion;

a parity check is carried out on a port address for a command received by said communication port with at least one parity bit, said parity check executing to check the parity bit of the port address for responsive passage through said first part of the address path; and, the parity bit for at least one of said conversion stages is adaptively converted according to said conversion response.

20. The method as recited in claim 15, wherein:

a plurality of said conversion stages are executed in pipelined manner intercoupled through intermediate registers in said interface logic portion; and, a parity check is carried out on a port address for a command received by said communication port with at least one parity bit, said parity check executing to check and responsively remove the parity bit from the port address for passage through said first part of the address path.

* * * * *